(12) United States Patent
Abe et al.

(10) Patent No.: US 9,111,854 B2
(45) Date of Patent: Aug. 18, 2015

(54) NON-VOLATILE MEMORY, WRITING METHOD FOR THE SAME, AND READING METHOD FOR THE SAME

(71) Applicant: KABUSHIKI KAISHA TOSHIBA, Minato-ku, Tokyo (JP)

(72) Inventors: Keiko Abe, Yokohama (JP); Chika Tanaka, Yokohama (JP); Hiroki Noguchi, Yokohama (JP); Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/217,888

(22) Filed: Mar. 18, 2014

(65) Prior Publication Data

US 2014/0339616 A1 Nov. 20, 2014

(30) Foreign Application Priority Data

May 20, 2013 (JP) ................................. 2013-106520

(51) Int. Cl.
*G11C 14/00* (2006.01)
*H01L 27/22* (2006.01)

(52) U.S. Cl.
CPC .......... *H01L 27/228* (2013.01); *G11C 14/0081* (2013.01)

(58) Field of Classification Search
CPC . G11C 11/16; G11C 14/0081; G11C 14/0054
USPC .............. 257/E21.101; 365/171, 173, 185.05
See application file for complete search history.

(56) References Cited

U.S. PATENT DOCUMENTS

| | | | |
|---|---|---|---|
| 6,269,027 B1 | 7/2001 | Hurst, Jr. et al. | |
| 6,847,543 B2 * | 1/2005 | Toyoda et al. | ................ 365/154 |
| 8,680,887 B2 | 3/2014 | Abe et al. | |
| 2004/0052106 A1 | 3/2004 | Ohtani | |
| 2012/0182064 A1 * | 7/2012 | Hiramoto et al. | ............. 327/540 |

* cited by examiner

*Primary Examiner* — Jose R Diaz
(74) *Attorney, Agent, or Firm* — Finnegan, Henderson, Farabow, Garrett & Dunner, L.L.P.

(57) ABSTRACT

A non-volatile memory of an embodiment includes a plurality of memory cells, each of the memory cells including a plurality of transistors including a first to fourth transistors, a first non-volatile element, a second non-volatile element, a first node, and a second node, the first and second transistors being connected in series with the first non-volatile element, the third and fourth transistors being connected in series with the second non-volatile element, the first node being disposed between the first and second transistors, the second node being disposed between the third and fourth transistors, gates of the first and third transistors being connected to one of first wiring lines, a gate of the second transistor being connected to the second node, a gate of the fourth transistor being connected to the first node, the first transistor being connected between one of second wiring lines and the first node.

16 Claims, 23 Drawing Sheets

|  | Operation | BL | SL | /SL | /BL |
|---|---|---|---|---|---|
| SRAM MODE | Read "0" | Discharge | 0 | 0 | Keep |
| | Read "1" | Keep | 0 | 0 | Discharge |
| | Write "0" | 0 | 0 | 0 | 1 |
| | Write "1" | 1 | 0 | 0 | 0 |
| MRAM MODE | Read "0" | $V_{READ}$ | 0 | 0 | $V_{READ}$ |
| | Read "1" | $V_{READ}$ | 0 | 0 | $V_{READ}$ |
| | Write "0" | Vmh | Vm | Vm | Vml |
| | Write "1" | Vml | Vm | Vm | Vmh |

(a)

|  | Operation | BL | SL | /SL | /BL |
|---|---|---|---|---|---|
| SRAM | Read "0" | Discharge | 0 | 0 | Keep |
| | Read "1" | Keep | 0 | 0 | Discharge |
| | Write "0" | 0 | 0 | 0 | 1 |
| | Write "1" | 1 | 0 | 0 | 0 |
| MRAM | Read "0" | $V_{READ}$ | 0 | 0 | $V_{READ}$ |
| | Read "1" | $V_{READ}$ | 0 | 0 | $V_{READ}$ |
| | Write "0" | $V_{DD}$ | 0 | $V_{DD}$ | $V_{DD}$ |
| | | $V_{DD}$ | $V_{DD}$ | $V_{DD}$ | 0 |
| | Write "1" | 0 | $V_{DD}$ | $V_{DD}$ | $V_{DD}$ |
| | | $V_{DD}$ | $V_{DD}$ | 0 | $V_{DD}$ |

| | Operation | BL | SL | /SL | /BL |
|---|---|---|---|---|---|
| SRAM | Read "0" | Discharge | 0 | 0 | Keep |
| | Read "1" | Keep | 0 | 0 | Discharge |
| | Write "0" | 0 | 0 | 0 | 1 |
| | Write "1" | 1 | 0 | 0 | 0 |
| MRAM | Read "0" | $V_{READ}$ | 0 | 0 | $V_{READ}$ |
| | Read "1" | $V_{READ}$ | 0 | 0 | $V_{READ}$ |
| | Write "0" | Vmh | Vm | Vm | Vml |
| | Write "1" | Vml | Vm | Vm | Vmh |

(a)

| | Operation | BL | SL | /SL | /BL |
|---|---|---|---|---|---|
| SRAM | Read "0" | Discharge | 0 | 0 | Keep |
| | Read "1" | Keep | 0 | 0 | Discharge |
| | Write "0" | 0 | 0 | 0 | 1 |
| | Write "1" | 1 | 0 | 0 | 0 |
| MRAM | Read "0" | $V_{READ}$ | 0 | 0 | $V_{READ}$ |
| | Read "1" | $V_{READ}$ | 0 | 0 | $V_{READ}$ |
| | Write "0" | $V_{DD}$ | 0 | $V_{DD}$ | $V_{DD}$ |
| | | $V_{DD}$ | $V_{DD}$ | $V_{DD}$ | 0 |
| | Write "1" | 0 | $V_{DD}$ | $V_{DD}$ | $V_{DD}$ |
| | | $V_{DD}$ | $V_{DD}$ | 0 | $V_{DD}$ |

| | Operation | BL | SL | /SL | /BL |
|---|---|---|---|---|---|
| SRAM | Read "0" | Discharge | 0 | 0 | Keep |
| | Read "1" | Keep | 0 | 0 | Discharge |
| | Write "0" | 0 | 0 | 0 | 1 |
| | Write "1" | 1 | 0 | 0 | 0 |
| MRAM | Read "0" | $V_{READ}$ | 0 | 0 | $V_{READ}$ |
| | Read "1" | $V_{READ}$ | 0 | 0 | $V_{READ}$ |
| | Write "0" | Vmh | Vm | $V_{DD}$ | $V_{DD}$ |
| | | $V_{DD}$ | $V_{DD}$ | Vm | Vml |
| | Write "1" | Vml | Vm | $V_{DD}$ | $V_{DD}$ |
| | | $V_{DD}$ | $V_{DD}$ | Vm | Vmh |

FIG. 29

NON-VOLATILE MEMORY, WRITING METHOD FOR THE SAME, AND READING METHOD FOR THE SAME

CROSS REFERENCE TO RELATED APPLICATIONS

This application is based upon and claims the benefit of priority from prior Japanese Patent Application No. 2013-106520 filed on May 20, 2013 in Japan, the entire contents of which are Incorporated herein by reference.

FIELD

Embodiments described herein relate generally to a non-volatile memory, a writing method for the same, and a reading method for the same.

BACKGROUND

Processors incorporated in portable information terminals are expected to consume low power. In order to reduce the power of processors, a method is suggested, in which an SRAM (Static Random Access Memory)-based cache memory that consumes a large standby power is replaced with an SRAM including non-volatile elements. As the transistors in SRAMs are downsized, leakage power increases in both the operating mode and the standby mode. If a cache memory is replaced with a non-volatile SRAM, unnecessary power supply can be cut off. This leads to a reduction in standby power consumption.

A non-volatile SRAM that is based on SRAM cells each including, for example, six MOS transistors has been suggested as a non-volatile memory that can perform high-speed SRAM operations. For example, a non-volatile SRAM including SRAM cells each including six transistors and two magnetic tunnel Junction (MTJ) elements as magnetoresistive memory devices is suggested. Such a non-volatile SRAM has an SRAM cell configuration in which there is a leakage current path from a power supply to GND. This non-volatile SRAM can reduce standby power consumption because of its non-volatile characteristics, but cannot reduce the operating power consumption.

BRIEF DESCRIPTION OF THE DRAWINGS

FIGS. 16(a) and 16(b) are diagrams showing voltages applied in SRAM operations and MRAM operations of the non-volatile memory according to the sixth embodiment.

FIGS. 18(a) and 18(b) are diagrams showing voltages applied in SRAM operations and MRAM operations of the non-volatile memory according to the seventh embodiment.

FIG. 29 is a diagram showing voltages applied in SRAM operations and MRAM operations of the non-volatile memories according to the sixth and the seventh embodiments.

DETAILED DESCRIPTION

A non-volatile memory according to an embodiment includes: a plurality of memory cells arranged in a matrix form; a plurality of first wiring lines each corresponding to memory cells of a common row; a plurality of second wiring lines and a plurality of third wiring lines, each of the plurality of second wiring lines corresponding to memory cells of a common column, each of the plurality of third wiring lines corresponding to memory cells of the common column; and a plurality of fourth wiring lines each corresponding to one of the memory cells of the common row and the memory cells of the common column; each of the memory cells including a plurality of transistors, a first non-volatile element, a second non-volatile element, a first node, and a second node, the transistors including a first transistor, a second transistor, a third transistor, and a fourth transistor, the first transistor and the second transistor being connected in series with the first non-volatile element, the third transistor and the fourth transistor being connected in series with the second non-volatile element, the first node being disposed between the first transistor and the second transistor, the second node being disposed between the third transistor and the fourth transistor, gates of the first transistor and the third transistor being connected to one of the first wiring lines, a gate of the second transistor being connected to the second node, a gate of the fourth transistor being connected to the first node, the first transistor being connected between one of the second wiring lines and the first node, the second transistor being connected between the first node and one of the fourth wiring lines, the third transistor being connected between one of the third wiring lines and the second node, the fourth transistor being connected between the second node and the one of the fourth wiring lines, the first non-volatile element being disposed between the one of the second wiring lines and the first transistor, between the first transistor and the first node, between the first node and the second transistor, or between the second transistor and the one of the fourth wiring lines, and the second non-volatile element being disposed at a location corresponding to a location of the first non-volatile element, between the one of the third wiring lines and the third transistor, between the third transistor and the second node, between the second node and the fourth transistor, or between the fourth transistor and the one of the fourth wiring lines.

Embodiments will now be explained with reference to the accompanying drawings.

(First Embodiment)

Figure 1:
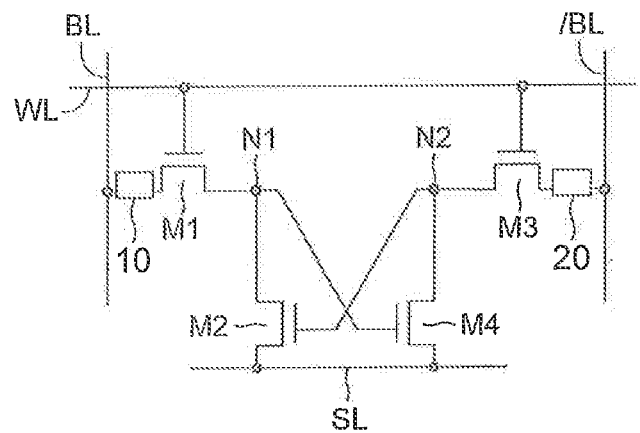
FIG. 1 is a circuit diagram showing a memory cell according to a first embodiment.

A non-volatile memory according to the first embodiment will be described with reference to FIGS. 1 and 2. The non-volatile memory according to the first embodiment includes a memory cell array in which a plurality of memory cells is arranged in an array form. Each memory cell has the same configuration. FIG. 1 shows one memory cell, which has four MOS transistors M1-M4 and two MTJ elements 10, 20.

The transistor M1 and the transistor M2 are connected in series, and the transistor M3 and the transistor M4 are connected in series. The gates of the transistors M1, M3 are connected to a word line WL. One of the source and the drain of the transistor M1 is connected to a bit line BL via an MTJ element 10, and one of the source and the drain of the transistor M3 is connected to a bit line /BL via an MTJ element 20. Thus, one of the source and the drain of the transistor M1 is connected to an terminal of the MTJ element 10, and the other terminal of the MTJ element 10 is connected to the bit line BL. One of the source and the drain of the transistor M3 is connected to one terminal of the MTJ element 20, and the other terminal of the MTJ element 20 is connected to the bit line /BL. The other of the source and the drain of the transistor M1 is connected to one of the source and the drain of the transistor M2 via a node N1, and the other of the source and the drain of the transistor M3 is connected to one of the source and the drain of the transistor M4 via a node N2. The other of the source and the drain of each of the transistors M2, M4 is connected to a source line SL. Furthermore, the gate of the transistor M2 is connected to the node N2, and the gate of the transistor M4 is connected to the node N1.

An MTJ element includes a first magnetic layer, a second magnetic layer, and a tunnel barrier layer sandwiched between the first magnetic layer and the second magnetic layer. Data "0" or "1" is stored depending on whether the magnetization direction of the first magnetic layer is parallel to (in the same direction as) or antiparallel to (In the opposite direction to) that of the second magnetic layer. The data "0" may correspond to the state where the magnetization direction of the first magnetic layer is antiparallel to that of the second magnetic layer, and the data "1" may correspond to the state where the magnetization direction is parallel to that of the second magnetic layer. In one memory cell, the data stored in the MTJ element 10 and the data stored in the MTJ element 20 are set to be complementary to each other. For example, the data stored in the MTJ element 10 is "0," and the data stored in the MTJ element 20 is "1." The order of stacking the first magnetic layer, the tunnel barrier layer, and the second magnetic layer in the MTJ element 10 is the same as the order in the MTJ element 20.

Figure 2:
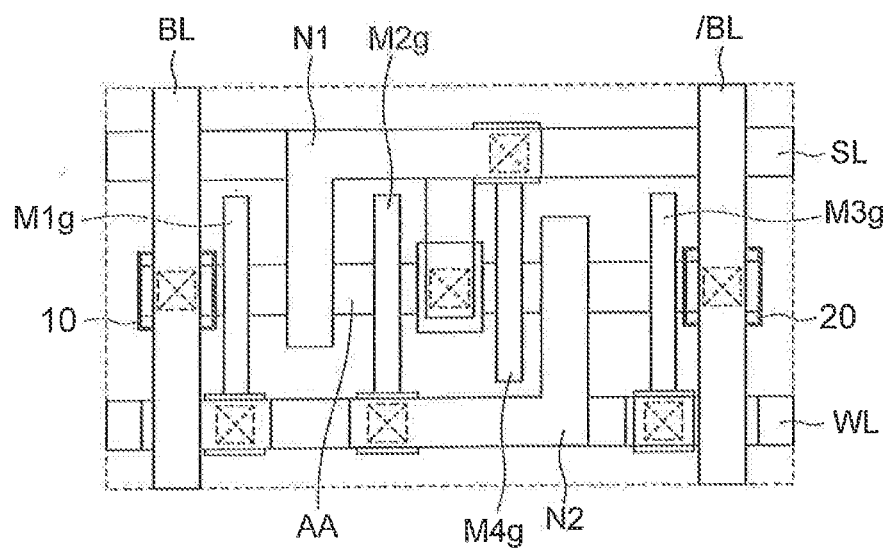
FIG. 2 is a diagram showing a layout of the memory cell according to the first embodiment.

FIG. 2 shows an example of the layout of the memory cell 1 having such a configuration. In this example, the word line WL and the source line SL are parallel to each other, and the bit lines BL, /BL intersect the word line WL and the source line SL at a right angle, for example. In FIG. 2, M1$g$, M2$g$, M3$g$, M4$g$ indicate the gates of the transistors M1, M2, M3, M4. In the layout shown in FIG. 2, the MTJ elements 10, 20 are located outside all the transistors M1-M4. Accordingly, the MTJ elements 10, 20 do not adversely affect the characteristics of the transistors M1-M4.

Figure 4:
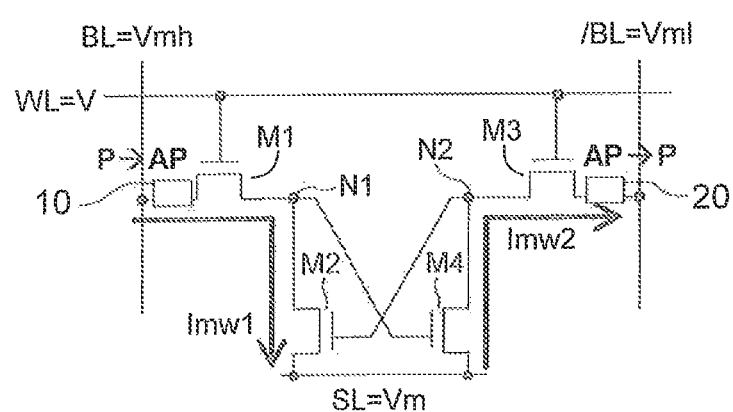
FIG. 4 is a diagram for explaining how non-volatile data are written to the memory cell according to the first embodiment.
Figure 5:
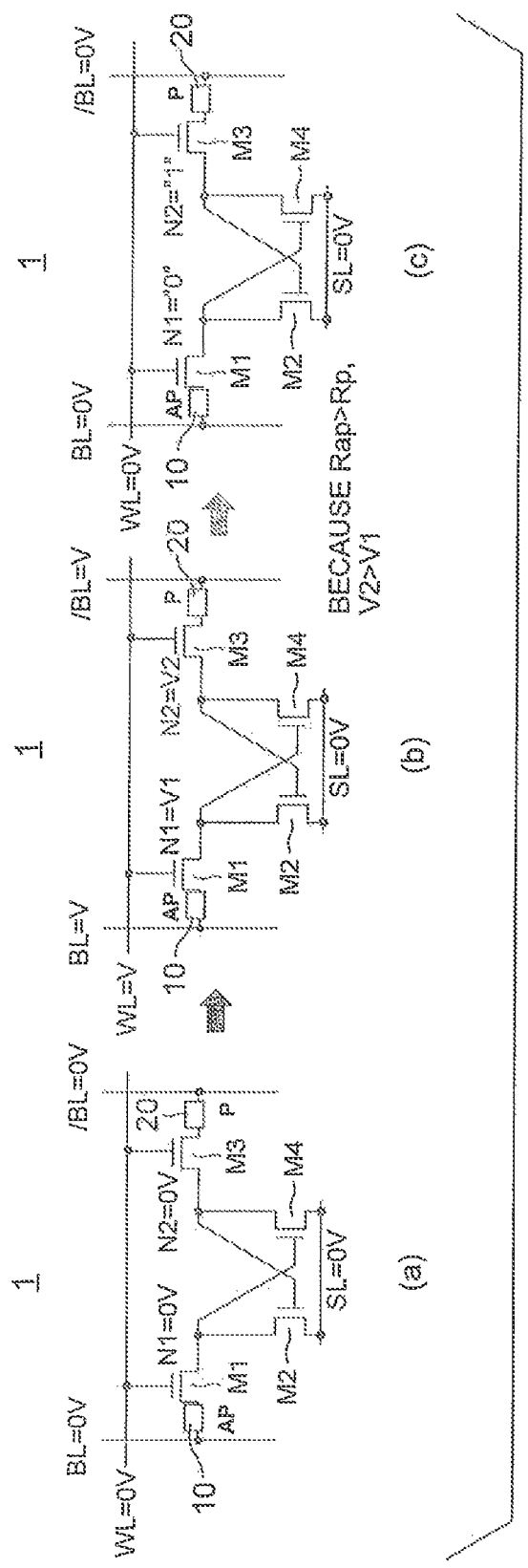
FIGS. 5(a) to 5(c) are diagrams for explaining how non-volatile data are read from the memory cell according to the first embodiment.

Next, the circuit operation of the memory cell according to the first embodiment will be described with reference to FIG. 3 to FIG. 5($c$).

(Operations to Write/Read SRAM Data)

If the memory cell 1 shown in FIG. 1 operates in an SRAM, the source line SL is connected to a ground power supply GND and maintained at 0 V, and the word line WL and the bit lines BL, /BL are supplied with electrical signals that are the same as those supplied in a read operation or write operation in an ordinary SRAM. In a write operation, voltages V, 0 (or 0, V) are applied to the bit lines BL, /BL, and the word line WL is selected to write the SRAM data "0", "1" (or "1", "0") to the nodes N1, N2 of the memory cell 1.

Figure 3:
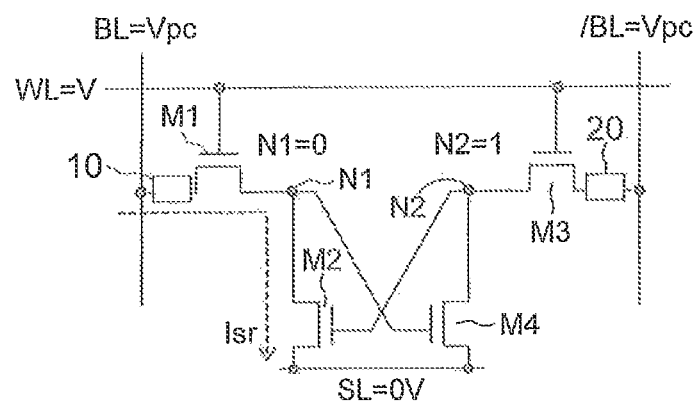
FIG. 3 is a diagram for explaining how SRAM data are read from the memory cell according to the first embodiment.

In a read operation, the potentials of the bit lines BL, /BL are maintained at a pre-charge potential Vpc, the source line SL is connected to the ground power supply GND, and a power supply voltage V is applied to the word line WL as shown in FIG. 3. As a result, the memory cell 1 is selected, and the transistor M2 (or transistor M4), the gate of which is connected to the node N2 (or node N1) storing the SRAM data "1," is turned ON. Then, the node N1 (or node N2) storing the SRAM data "0" is connected to the ground power supply GND via the transistor M2 (or transistor M4) and the source line SL, and a read current Isr for reading the SRAM data flows through the bit line BL (or bit line /BL). In this manner, the SRAM data stored in the node N1 (or node N2) is read.

(Operation to Write Non-Volatile Data)

When non-volatile data is written to the memory cell 1, the SRAM data stored in the target memory cell 1 is read in the first step in a manner shown in FIG. 3. Subsequently, data corresponding to the SRAM data read in the first step is written to the MTJ element in the second step. For example, a case where the read operation in the first step indicates that the SRAM data stored in the node N1 is "0" and the SRAM data stored in the node N2 is "1" will be described below. In this case, a voltage Vm is applied to the source line SL, a voltage Vmh higher than the voltage Vm is applied to the bit line BL, and a voltage Vml lower than the voltage Vm is applied to the bit line /BL as shown in FIG. 4, where Vmh>Vm>Vml. If the word line WL is selected in this state, a write current Imw1 flows from the bit line BL to the source line SL, and a write current Imw2 flows from the source line SL to the bit line /BL. The write current Imw1 switches the magnetization direction of the MTJ element 10 from the parallel state (P state) to the antiparallel state (AP state), and the write current Imw2 switches the magnetization direction of the MTJ element 20 from the antiparallel state (AP state) to the parallel state (P state). As a result, the MTJ element 10 is brought into the high-resistance state (antiparallel state AP), and the MTJ element 20 is brought into the low-resistance state (parallel state P).

If, after the read operation in the first step, the SRAM data stored in the node N1 is "1" and the SRAM data stored in the node N2 is "0," the voltage Vm is applied to the source line SL, and the voltage Vmh that is higher than the voltage Vm is applied to the bit line /BL, and the voltage Vml that is lower than the voltage Vm is applied to the bit line BL. If the word line WL is selected in this state, the write current Imw1 flows from the bit line /BL to the source line SL, and the write current Imw2 flows from the source line SL to the bit line BL, as is different from the case shown in FIG. 4. The write current Imw1 switches the magnetization direction of the MTJ element 20 from the parallel state (P state) to the antiparallel state (AP state), and the write current Imw2 switches the magnetization direction of the MTJ element 10 from the antiparallel state (AP state) to the parallel state (P state).

When non-volatile data is written to the memory cell 1, the voltage levels of the source line SL and the bit lines BL, /BL are selected such that a current flows through each of the MTJ elements 10, 20 bi-directionally to write complementary data thereto. A negative voltage applied to the bit lines BL, /BL and the substrate bias of the transistors M1-M4a may be used to cause currents to flow bi-directionally.

(Operation to Read Non-Volatile Data)

When non-volatile data is read from the memory cell 1, the power supply of the memory cell array is in the OFF state, and each of the nodes N1, N2 in the memory cell is in a discharged state. As shown in FIG. 5(a), the initial voltage levels are set such that the source line SL is at 0 V, the word line WL is at 0 V, the bit lines BL, /BL are at 0 V, and the nodes N1, N2 are at 0 V. It is assumed that the MTJ element 10 is in the high-resistance state AP, and the MTJ element 20 is in the low-resistance state P as shown in FIG. 5(b). A voltage of 0 V is applied to the source line SL, a power supply voltage V or pre-charge voltage Vpc is applied to the bit lines BL, /BL, and the voltage applied to the word line WL is changed from 0 V to V. The same voltage is applied to the bit lines BL, /BL, but different voltages may be applied to the word line WL and the bit lines BL, /BL. As a result, the voltages are split depending on the resistance values of the MTJ elements 10, 20 that are connected in series between the source line SL and the bit line BL, and between the source line SL and the bit line /BL, to set the potentials of the nodes N1, N2 to be N1=V1, and N2=V2 (FIG. 5(b)). The resistance value Rap obtained when the MTJ elements 10, 20 are in the high-resistance state is greater than the resistance value Rp obtained when they are in the low-resistance state. This makes V2 greater than V1. These voltages are amplified at the cross-coupled portion. Thereafter, the voltage of the word line WL is changed to 0 V again, and the voltage of the bit lines BL, /BL is changed to 0 V again, as shown in FIG. 5(c). As a result, the SRAM data "0" is stored in the node N1, and the SRAM data "1" is stored in the node N2, and the read operation is completed.

As described above, different voltages are applied to the source line SL depending on operations. In other words, the source line SL is connected to different power supplies depending on operations.

The gate length and the gate width of the transistors M1, M2, M3, M4 are selected such that when the memory cell 1 operates in an SRAM, the read operation and the write operation can be stably performed. In addition, the gate length and the gate width of the transistors M1, M2, M3, M4 should be selected such that when the memory cell 1 operates in a non-volatile memory, i.e., when the MTJ elements 10, 20 store data, a write current flows through each of the MTJ elements 10, 20. How the gate length and the gate width of the transistors M1, M2, M3, M4 are selected also relates to the voltage levels of the word line WL, the bit line BL, and the source line SL. An optimum combination is selected in consideration of the characteristics of the MTJ elements 10, 20 by means of a circuit simulation. The above also applies to the second and the third embodiments described later.

As described above, the memory cell 1 according to the first embodiment includes a no-load SRAM cell including four transistors M1-M4, and MTJ elements 10, 20 disposed between the no-load SRAM cell and the bit lines BL, /BL. Therefore, no leakage current path is present between the power supply and GND, and the nodes N1, N2 for storing SRAM data are not connected to any of the wiring lines shared by other memory cells, and are independently present. Thus, there is no path through which the SRAM data is erased. Therefore, according to the first embodiment, the standby and operating power consumption can be reduced, and the loss of SRAM data can be prevented.

Furthermore, according to the first embodiment, non-volatile data can be written to each of the MTJ elements by passing a current bi-directionally through the MTJ element using the source line SL. The source line SL is shared by adjacent memory cells disposed in a row (left and right) direction. Accordingly, a non-volatile SRAM cell can be achieved, which does not cause a loss of SRAM data present in the same column when non-volatile data is written thereto.

(Second Embodiment)

Figure 6:
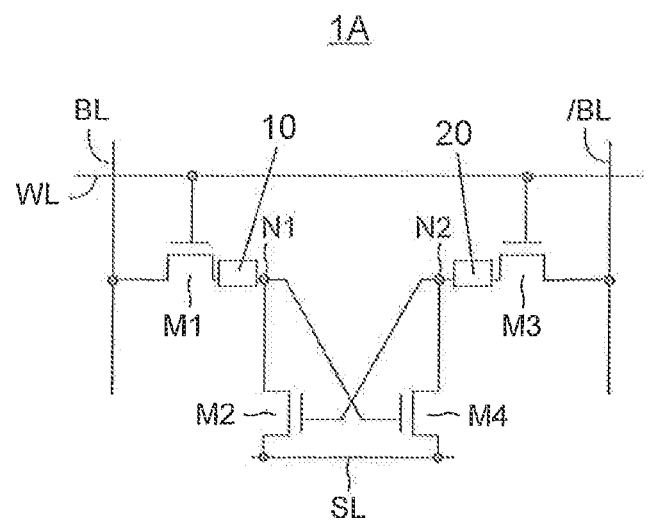
FIG. 6 is a circuit diagram showing a memory cell according to a second embodiment.

A non-volatile memory according to the second embodiment will be described with reference to FIGS. 6 and 7. The non-volatile memory according to the second embodiment includes a memory cell array in which a plurality of memory cells is arranged in an array form. Each memory cell has the same configuration, which is shown in FIG. 6. The memory cell 1A according to the second embodiment is obtained by disposing the MTJ element 10, which is deposed between the bit line BL and one of the source and the drain of the transistor M1 In the memory cell 1 according to the first embodiment shown in FIG. 1, between one of the source and the drain of the transistor M1 and the node N1, and disposing the MTJ element 20, which is disposed between the bit line /BL and one of the source and the drain of the transistor M3 in the first embodiment, between one of the source and the drain of the transistor M3 and the node N2.

Figure 7:
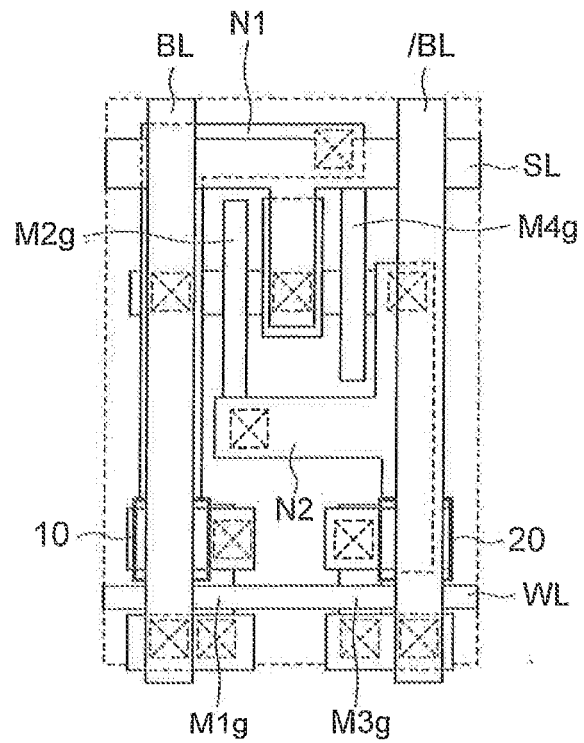
FIG. 7 is a diagram showing a layout of the memory cell according to the second embodiment.

FIG. 7 shows an example of layout of the memory cell 1A according to the second embodiment. In this layout, the word line WL and the source line are parallel to each other, and intersect the bit lines BL, /BL at a right angle, for example.

If the MTJ elements 10, 20 of the second embodiment are regarded as resistances, the MTJ elements 10, 20 affect the transistors M1, M3 as parasitic resistances, and the read characteristics can be improved as compared to those in the first embodiment.

The circuit operation of the memory cell according to the second embodiment is the same as that of the memory cell according to the first embodiment.

As in the case of the first embodiment, the memory cell 1A according to the second embodiment has a configuration in which the MTJ elements 10, 20 are disposed between the transistor M1 and the node N1, and between the transistor M3 and the node N2 of a no-load SRAM cell including the four transistors M1-M4. As a result, no leakage current path is present between the power supply and the GND, and the nodes N1, N2 for storing SRAM data are not connected to any of the wiring lines shared by other memory cells, and are independently present. Thus, there is no path through which the SRAM data is erased. Therefore, according to the second embodiment, the standby and operating power consumption can be reduced, and the loss of SRAM data can be prevented.

Furthermore, non-volatile data can be written to each of the MTJ elements by passing a current bi-directionally through the MTJ element using the source line SL. The source line SL is shared by adjacent memory cells disposed in a row (left and right) direction. Accordingly, a non-volatile SRAM cell can be achieved, which does not cause a loss of SRAM data present in the same column when the non-volatile data is written thereto.

(Third Embodiment)

Figure 8:
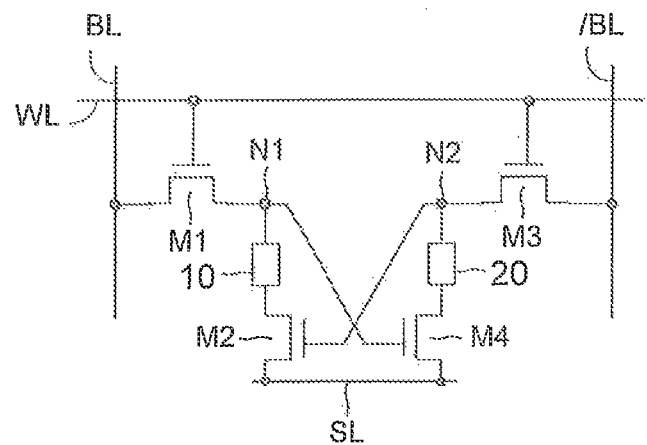
FIG. 8 is a circuit diagram showing a memory cell according to a third embodiment.

A non-volatile memory according to the third embodiment will be described with reference to FIGS. 8 and 9. The non-volatile memory according to the third embodiment includes a memory cell array in which a plurality of memory cells is arranged in an array form. Each memory cell has the same configuration, which is shown in FIG. 8. The memory cell 1B of the third embodiment is obtained by disposing the MTJ element 10, which is disposed between the bit line BL and one of the source and the drain of the transistor M1 in the memory cell 1 of the first embodiment shown in FIG. 1, between the node N1 and one of the source and the drain of the transistor M2, and disposing the MTJ element 20, which is disposed between the bit line /BL and one of the source and the drain of the transistor M3 in the first embodiment, between the node N2 and one of the source and the drain of the transistor M4.

Figure 9:
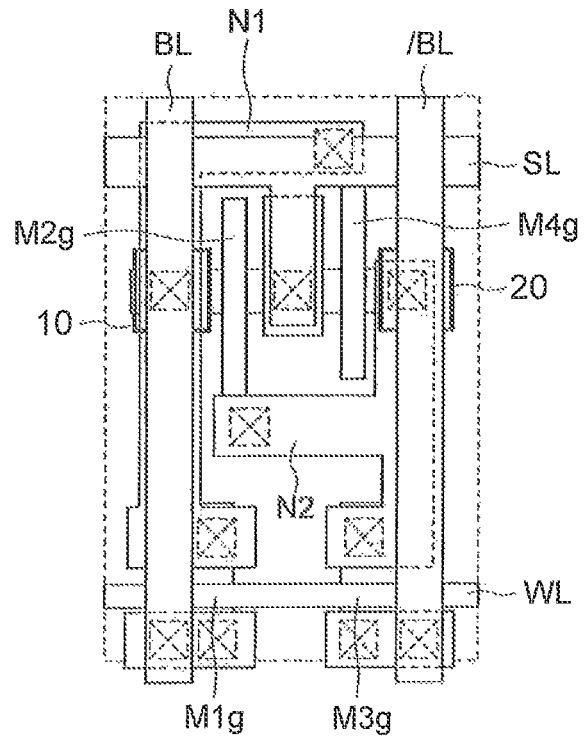
FIG. 9 is a diagram showing a layout of the memory cell according to the third embodiment.

FIG. 9 shows an example of layout of the memory cell 1B according to the third embodiment. In this layout, the word line WL and the source line SL are disposed to be parallel to each other, and the bit lines BL, /BL intersect the word line WL and the source line SL at a right angle, for example.

If the MTJ elements 10, 20 of the third embodiment are regarded as resistances, the MTJ elements 10, 20 affect the transistors M2, M4 as parasitic resistances, and the write characteristics can be improved as compared to those in the first embodiment.

The circuit operation of the memory cell according to the third embodiment will be described with reference to FIGS. 10 to 12(c).

(Operations to Write/Read SRAM Data)

Figure 10:
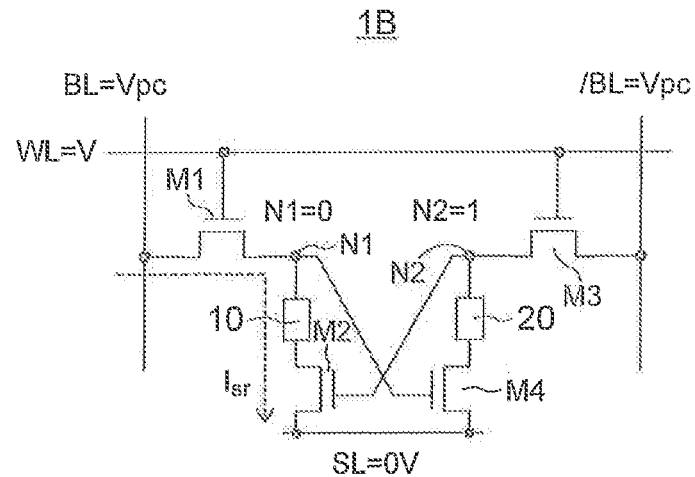
FIG. 10 is a diagram for explaining how SRAM data are read from the memory cell according to the third embodiment.

The memory cell 1B of the third embodiment operates in an SRAM in the same manner as the memory cell 1 of the first or second embodiment. Specifically, the source line SL is connected to the ground power supply GND and maintained at 0 V, and the word line WL and the bit lines BL, /BL are supplied with electrical signals that are the same as those supplied in the read operation or write operation in an SRAM. In a write operation, voltages V, 0 (or 0, V) are applied to the bit lines BL, /BL, and the word line WL is selected to write SRAM data "0," "1" (or "1," "0") to the nodes N1, N2 of the memory cell 1. In a read operation, the potentials of the bit lines BL, /BL are maintained at the pre-charge potential Vpc, the source line SL is connected to the ground power supply GND, and the power supply voltage V is applied to the word line WL, as shown in FIG. 10. As a result, the memory cell 1 is selected, and the transistor M2 (or transistor M4), the gate of which is connected to the node N2 (or node N1) storing the SRAM data "1," is turned ON. Then, the node N1 (or node N2) storing the SRAM data "0" is connected to the ground power supply GND via the transistor M2 (or transistor M4) and the source line SL, and a read current Isr for reading the SRAM data flows through the bit line BL (or bit line /BL). In this manner, the SRAM data stored in the node N1 (or node N2) is read.

(Operation to Write Non-Volatile Data)

Non-volatile data is written to the memory cell 1B in a manner different from that for the memory cells 1 and 1A in the first and the second embodiments. First, SRAM data is read in the same manner as in the first and the second embodiments in the first step as shown in FIG. 10.

Figure 11:
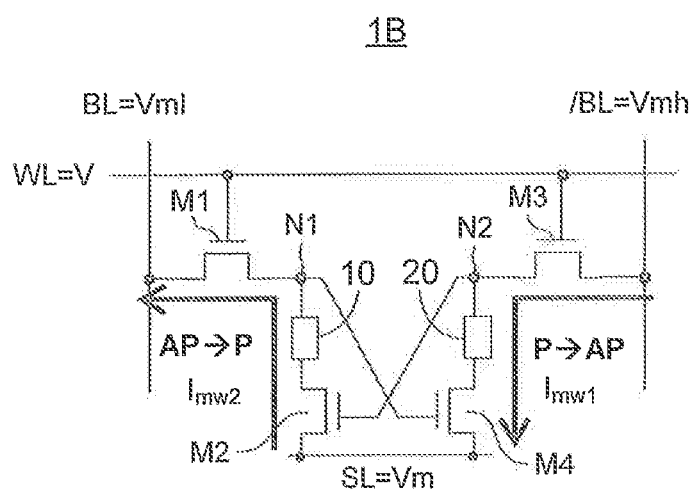
FIG. 11 is a diagram for explaining how non-volatile data are written to the memory cell according to the third embodiment.
Figure 12:
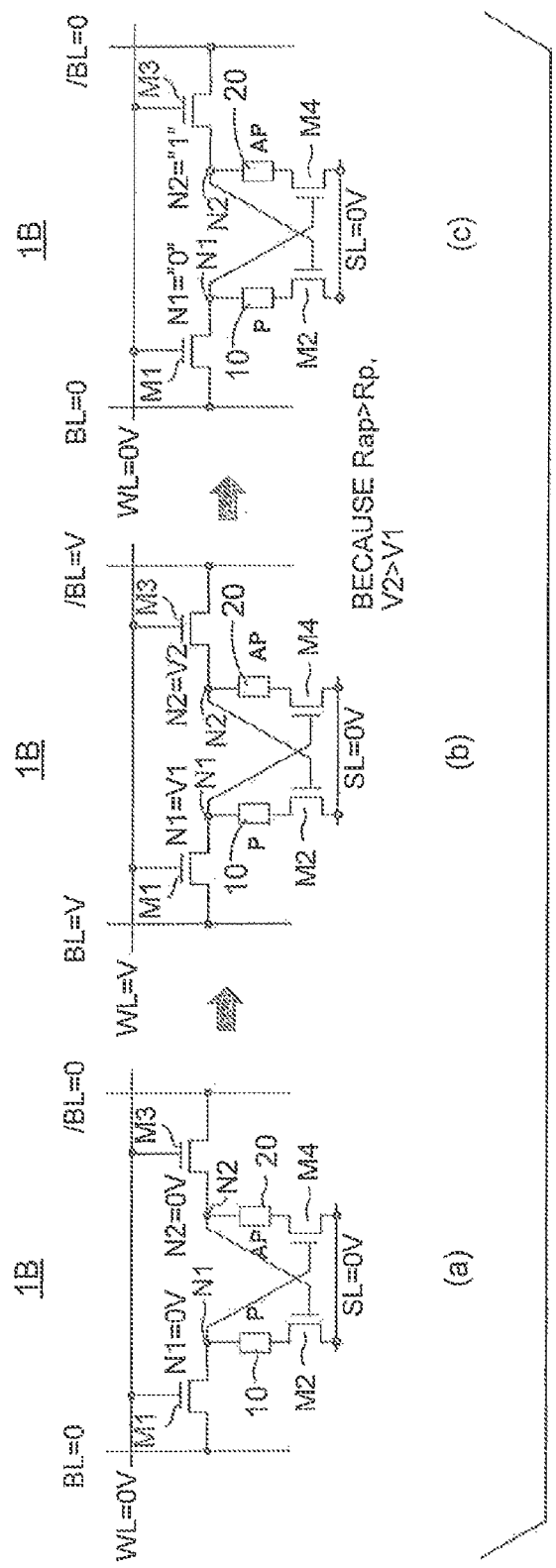
FIGS. 12(a) to 12(c) are diagrams for explaining how non-volatile data are read from the memory cell according to the third embodiment.

Subsequently, the non-volatile data is written to each of the MTJ elements 10, 20 in the second step as shown in FIG. 11. Signals supplied to the bit lines BL, /BL and the source line SL are different from those in the first and the second embodiments. The reason for this is that the non-volatile data read is opposite to the corresponding SRAM data. A case where, after the first step, the SRAM data stored in the node N1 is "0" and the SRAM data stored in the node N2 is "1" will be described as an example. In this case, a voltage Vm is applied to the source line SL, a voltage Vml is applied to the bit line BL, and a voltage Vmh is applied to the bit line /BL, as shown in FIG. 11, where Vmh>Vm>Vml. If the word line WL is selected in this state, a write current Imw1 flows from the bit line /BL to the source line SL, and a write current Imw2 flows from the source line SL to the bit line BL. The write current Imw2 switches the magnetization direction of the MTJ element 10 from the antiparallel state (AP state) to the parallel state (P state), and the write current Imw1 switches the magnetization direction of the MTJ element 20 from the P state to the AP state. As a result, the MTJ element 10 is brought into the low-resistance state (parallel state P), and the MTJ element 20 is brought into the high-resistance state (antiparallel state AP).

If, after the read operation in the first step, the SRAM data stored in the node N1 is "1," and the SRAM data stored in the node N2 is "0," the voltage Vm is applied to the source line SL, the voltage Vmh is applied to the bit line BL, and the voltage Vml is applied to the bit line /BL, where Vmh>Vm>Vml. If the word line WL is selected in this state, the write current Imw1 flows from the bit line BL to the source line SL, and the write current Imw2 flows from the source line SL to the bit line /BL. The write current Imw1 switches the magnetization direction of the MTJ element 10 from the parallel state (P state) to the antiparallel state (AP state), and the write current Imw2 switches the magnetization direction of the MTJ element 20 from the antiparallel state (AP state) to the parallel state (P state). As a result, the MTJ element 10 is brought into the high-resistance state (antiparallel state AP), and the MTJ element 20 is brought into the low-resistance state (parallel state P).

(Operation to Read Non-Volatile Data)

Non-volatile data is read from the memory cell 1B in the same manner as in the first and the second embodiments. As shown in FIG. 12(a), the initial voltage levels are 0 V in the source line SL, 0 V in the word line WL, 0 V in the bit lines BL, /BL, and 0 V at the nodes N1, N2. It is assumed that the MTJ element 10 in the low-resistance state P, and the MTJ element 20 is in the high-resistance state AP as shown in FIG. 12(b). In this case, 0 V is applied to the source line SL, the power supply voltage V or pre-charge voltage Vpc is applied to the bit lines BL, /BL, and the voltage applied to the word line WL is changed from 0 V to V. As a result, the voltages are split depending on the resistance values of the MTJ elements 10, 20 that are connected in series between the source line SL and the bit line BL, and between the source line SL and the bit line /BL, to set the potentials of the nodes N1, N2 to be N1=V1 and N2=V2 (FIG. 12(b)). The resistance value Rap obtained when the MTJ elements 10, 20 are in the high-resistance state is greater than the resistance value Rp obtained when they are in the low-resistance state. This makes V2 greater than V1. These voltages are amplified at the cross-coupled portion. Thereafter, the voltage of the word line WL is changed to 0 V again, and the voltage of the bit lines BL, /BL is changed to 0 V again, as shown in FIG. 12(c). As a result, the SRAM data "0" is stored in the node N1, and the SRAM data "1" is stored in the node N2, and the read operation is completed.

Also in the third embodiment, different voltages are applied to the source line SL depending on operations. In other words, the source line SL is connected to different power supplies depending on operations.

As described above, the memory cell 1B according to the third embodiment includes a no-load SRAM cell including four transistors M1-M4, in which MTJ elements 10, 20 are disposed between nodes N1 and N2 and the transistors M2 and M4. Therefore, no leakage current path is present between the power supply and GND, and the nodes N1, N2 for storing SRAM data are not connected to any of the wiring lines shared by other memory cells, and are independently present. Thus, there is no path through which the SRAM data is erased. Therefore, according to the third embodiment, the standby and operating power consumption can be reduced, and the loss of SRAM data can be prevented.

Furthermore, according to the third embodiment, non-volatile data can be written to each the MTJ elements by passing a current bi-directionally through the MTJ element using the source line SL. The source line SL is shared by adjacent memory cells disposed in a row (left and right) direction. Accordingly, a non-volatile SRAM cell can be achieved, which does not cause a loss of SRAM data present in the same column when the non-volatile data is written thereto.

(Fourth Embodiment)

Figure 13:
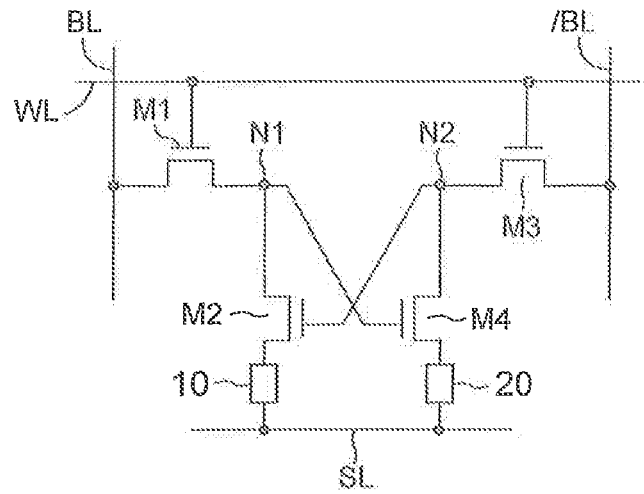
FIG. 13 is a circuit diagram showing a memory cell according to a fourth embodiment.

A non-volatile memory according to the fourth embodiment will be described with reference to FIG. 13. The non-volatile memory according to the fourth embodiment includes a memory cell array including a plurality of memory cells arranged in an array form. Each memory cell has the same configuration, which is shown in FIG. 13. The memory cell 1C of the fourth embodiment is obtained by disposing the MTJ element 10, which is disposed between the bit line BL and one of the source and the drain of the transistor M1 in the memory cell 1 according to the first embodiment shown in FIG. 1, between the other of the source and the drain of the transistor M2 and the source line SL, and disposing the MTJ element 20, which is disposed between the bit line /BL and one of the source and the drain of the transistor M3 in the first embodiment, between the other of the source and the drain of the transistor M4 and the source line SL.

As in the first embodiment, the non-volatile memory having such a configuration is also capable of reducing the standby and operating power consumption, and preventing the loss of SRAM data.

Furthermore, non-volatile data can be written to each of the MTJ elements by passing a current bi-directionally through the MTJ element using the source line SL. The source line SL is shared by adjacent memory cells disposed in a row (left and right) direction. Accordingly, a non-volatile SRAM cell can be achieved, which does not cause a loss of SRAM data present in the same column when the non-volatile data is written thereto.

(Fifth Embodiment)

Figure 14:
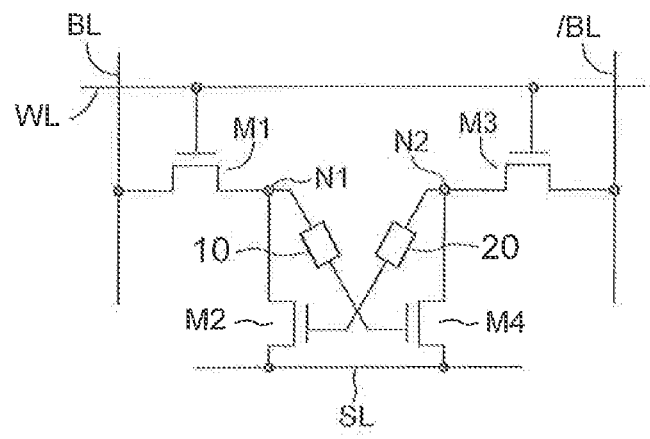
FIG. 14 is a circuit diagram showing a memory cell according to a fifth embodiment.

A non-volatile memory according to the fifth embodiment will be described with reference to FIG. 14. The non-volatile memory according to the fifth embodiment includes a memory cell array including a plurality of memory cells arranged in an array form. Each memory cell has the same configuration, which is shown in FIG. 14. The memory cell 1D of the fifth embodiment is obtained, by depositing the MTJ element 10, which is disposed between the bit line BL and one of the source and the drain of the transistor M1 in the memory cell 1 of the first embodiment shown in FIG. 1, between the node 1 and the gate of the transistor M4, and disposing the MTJ element 20, which is disposed between the bit line /BL and one of the source and the drain of the transistor M3 in the first embodiment, between the node N2 and the gate of the transistor M2.

In the fifth embodiment, an operation in the SRAM mode is performed in the same manner as that of the first embodiment. In the non-volatile mode, the writing of non-volatile data to the memory cell 1D is performed in the same manner as in the first embodiment, but the writing to the MTJ elements 10, 20 is performed using currents for charging or discharging gate capacitance flowing between the bit line BL and the gate of the transistor M4, and between the bit line /BL and the gate of the transistor M2 when current flow between the bit line BL and the source line SL, and between the bit line /BL and the source SL.

Non-volatile data is read from the memory cell 1D in the following manner. When non-volatile data is read from the memory cell 1D, the power supply to the memory cell array in the OFF state, and the nodes N1, N2 of the memory cell are discharged. The initial voltage levels are set such that the source line SL is at 0 V, the word line WL is at 0 V, the bit lines BL, /BL are at 0 V, and the nodes N1, N2 are at 0 V. It is assumed that the MTJ element 10 is in the high-resistance state AP, and the MTJ element 20 is in the low-resistance state P, in FIG. 14. A voltage of 0 V is applied to the source line SL, a power supply voltage V or pre-charge voltage Vpc is applied to the bit lines BL, /BL, and the voltage applied to the word line WL is changed from 0 V to V. The same voltage is applied to the bit lines BL, /BL, but different voltages may be applied to the word line WL and the bit lines BL, /BL. As a result, the difference in resistance between the MTJ element 10 and the MTJ element 20 makes the gate voltage of the transistor M4, the gate of which is connected to the MTJ element 10, to be lower than the gate voltage of the transistor M2, the gate of which is connected to the MTJ element 20. This makes the potential of the node N1 lower than that of the node N2. The potential difference is amplified by the cross-coupled portion. Thereafter, the voltage of the word line WL is changed to 0 V again, and the voltage of the bit lines BL, /BL is changed to 0 V. As a result, the SRAM data "0" is stored in the node N1, and the SRAM data "1" is stored in the node N2, and the read operation is completed.

Also in the fifth embodiment, different voltages are applied to the source line SL depending on operations. In other words, the source line SL is connected to difference power supplies depending on operations.

The non-volatile memory according to the fifth embodiment writes data to the MTJ elements 10, 20 using currents for charging and discharging the gates. Therefore, depending on the characteristics of the transistors forming each memory cell, it may not be possible to pass a sufficient write current therethrough. However, in such a case, the value of current required for writing data to the MTJ elements 10, 20 can be reduced by applying a magnetic field. As a result, it is possible to write data to the MTJ elements 10, 20. In the non-volatile memory according to the fifth embodiment, each MTJ element is connected to the gate of the transistor M2 or M4, i.e., connected to the gate contact. Thus, the layout of the memory cell is not complicated. Furthermore, since each MTJ element is directly connected to the gate of the transistor M2 or M4, the capability of driving current flowing through the transistors M2, M4 can be changed depending on the resistance values of the MTJ elements. Accordingly, the values stored in the MTJ elements can be easily read at the nodes N1 and N2. Therefore, the fifth embodiment is effective not for data that is frequently rewritten, but data that is once written and frequently read in a read only memory (ROM).

The non-volatile memory according to the fifth embodiment is capable of reducing the standby and operating power consumption and preventing the loss of SRAM data, as in the case of the first embodiment.

(Sixth Embodiment)

A non-volatile memory according to the sixth embodiment will be described with reference to FIGS. 15 to 16(b). In each the non-volatile memories according to the first to the fifth embodiments, a source line, which is parallel to a word line WL, is provided to each row of memory cells. The non-volatile memory according to the sixth embodiment has the same configuration as the first to the fifth embodiments except for the source line. In the sixth embodiment, a pair of source lines SL, /SL is provided to each row of memory cells, which are parallel to the word line WL. For simplification of explanation, each memory cell of the sixth embodiment is assumed to have the same configuration as the memory cell of the first embodiment shown in FIG. 1. The memory cell may be the memory cell 1A of the second embodiment shown in FIG. 6, the memory cell 1B of the third embodiment shown in FIG. 8, the memory cell 1C of the fourth embodiment shown in FIG. 13, or the memory cell 1D of the fifth embodiment shown in FIG. 14.

Figure 15:
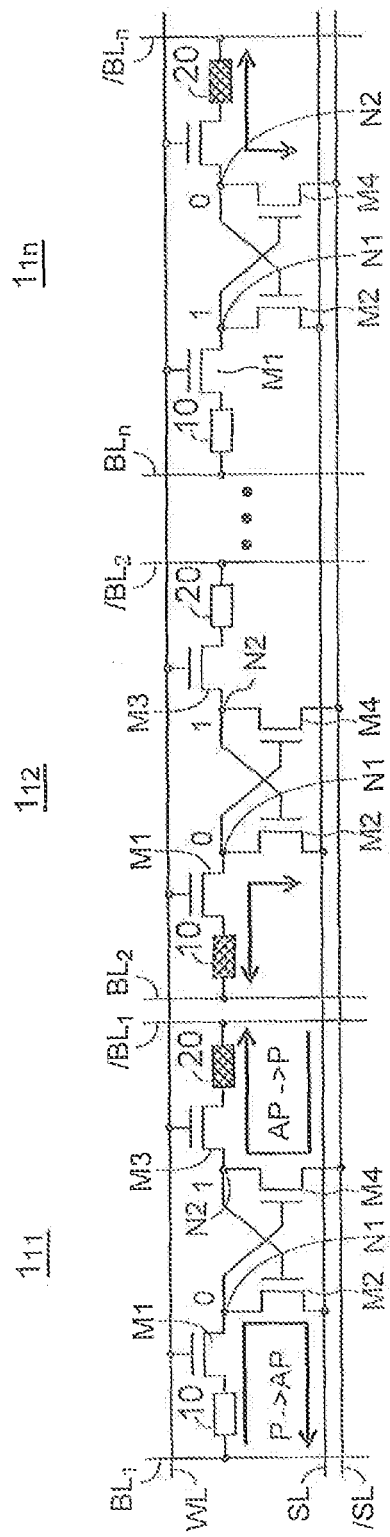
FIG. 15 is a circuit diagram showing a non-volatile memory according to a sixth embodiment.

FIG. 15 shows n memory cells $1_{11}$-$1_{1n}$ in a row, for example the first row, of the sixth embodiment. In each memory cell $1_{1i}$ (i=1, ... n), the other terminal of the MTJ element 10 is connected to the bit line $BL_i$, and the other terminal of the MTJ element 20 is connected to the bit line $/BL_i$. Furthermore, the other of the source and the drain of the transistor M2 in each memory cell is connected to the source line SL, and the other of the source and the drain of the transistor M4 is connected to the source line /SL.

FIGS. 16(a) and 16(b) show voltages applied to the bit lines BL, /BL and the source lines SL, /SL relating to a selected memory cell of the non-volatile memory according to the sixth embodiment, in an SRAM operation mode and a non-volatile operation mode (MRAM operation mode). FIG. 16(a) shows a case where the source lines SL, /SL are commonly controlled, and FIG. 16(b) shows a case where the source lines SL, /SL are independently controlled. Each of the SRAM operation mode and the MRAM operation mode includes read operations for data "0" and data "1," and write operations for data "0" and data "1." The indication "Keep" In the SRAM operation of FIGS. 16(a) and 16(b) means that the pre-charge voltage is maintained. The read operation in the MRAM mode in both the cases shown in FIGS. 16(a) and 16(b), and the operations in the MRAM mode in which the source lines SL, /SL are commonly controlled are performed in the same manner as the operations in first embodiment (see FIG. 16(a)).

Since the sixth embodiment includes two source line, SL and /SL, independent write operations can be performed on the MTJ element 10 and the MTJ element 20 in the MRAM operation mode (see FIG. 16(b)). Specifically, when a voltage is applied to the word line WL to select a memory cell, to which data "0" is to be written, the voltage applied to the source line SL is set at 0 V, and the voltages applied to the bit lines BL, /BL and the source line /SL are increased to $V_{DD}$ to forcibly turn on the transistor M2 to cause a write current to flow between the bit line BL and the source line SL, thereby writing the data to the MTJ element 10. Thereafter, the voltage applied to the bit line /BL is changed to 0 V, and the voltages applied to the source lines SL, /SL and the bit line BL are set at $V_{DD}$ to forcibly turn on the transistor M4 to cause a write current to flow between the bit line /BL and the source line /SL, thereby writing the data to the MTJ element 20. When a voltage is applied to the word line WL to select a memory cell, to which data "1" is to be written, the voltage applied to the bit line BL is set at 0 V, and the voltages applied to the source lines SL, /SL and the bit line BL are increased to $V_{DD}$ to forcibly turn on the transistor M2 to cause a write current to flow between the bit line BL and the source line SL, thereby writing the data to the MTJ element 10. Thereafter, the voltage applied to the source line /SL is changed to 0 V, and the voltages applied to the bit lines BL, /BL and the source line SL are set at $V_{DD}$ to forcibly turn on the transistor M4 to cause a write current to flow between the bit line /BL and the source line /SL, thereby writing the data to the MTJ element 20. The voltage $V_{DD}$ is higher than the voltages Vmh and Vml. If data are independently written to the MTJ element 10 and the MTJ element 20, such voltages as Vm, Vmh, Vml may be applied instead of 0 V, as shown in FIG. 29. Specifically, when a voltage is applied to the word line WL to select a memory cell, to which data "0" is to be written, the voltage applied to the source line SL is set at Vm, the voltage applied to the bit line BL is set at Vmh, and the voltages applied to the bit lines /BL and the source line /SL are set at Vdd to forcibly turn on the transistor M2 to cause a write current to flow between the bit line BL and the source line SL, thereby writing the data to the MTJ element 10. Thereafter, the voltage applied to the bit line /BL is set at Vml, the voltage applied to the source line /SL is set at Vm, and the voltages applied to the source line SL and the bit line BL are set at Vdd to forcibly turn on the transistor M4 to cause a write current to flow between the bit line /BL and the source line /SL, thereby writing the data to the MTJ element 20. When a voltage is applied to the word line WL to select a memory cell, to which data "1" is to be written, the voltage applied to the bit line BL is set at Vml, the voltage applied to the source line SL is set at Vm, and the voltages applied to the source line /SL and the bit line /BL are set at Vdd to forcibly turn on the transistor M2 to cause a write current to flow between the bit line BL and the source line SL, thereby writing the data to the MTJ element 10. Thereafter, the voltage applied to the source line /SL is set at Vm, the voltage applied to the bit line /BL is set at Vmh, and the voltages applied to the bit line BL and the source line SL are increased to Vdd to forcibly turn on the transistor M4 to cause a write current to flow between the bit line /BL and the source line /SL, thereby writing the data to the MTJ element 20.

Thus, the writing of non-volatile data can be performed easily by providing a pair of source lines SL, /SL to each row as in the sixth embodiment. In the sixth embodiment, different voltages may be applied to the source lines SL, /SL depending on operations. Thus, the source lines SL, /SL may be connected to different power supplies depending on operations.

FIG. 15 shows the case where the memory cell $1_{11}$ is selected, to which non-volatile data is to be written. In this case, the memory cells other than the memory cell $1_{11}$, the memory cells $1_{12}$-$1_{1n}$, are in a half-selected state.

According to the sixth embodiment, the standby and operating power consumption can be reduced, and the loss of SRAM data can be prevented as in the case of the first embodiment.

(Seventh Embodiment)

A non-volatile memory according to the seventh embodiment will be described with reference to FIGS. 17 and 18. In each of the non-volatile memories according to the first to the fifth embodiments, a source line, which is parallel to a word line WL, is provided to each row of memory cells. The non-volatile memory according to the seventh embodiment has the same configuration as the first to the fifth embodiments except for the source line. In the seventh embodiment, a pair of source lines SL, /SL that is parallel to a pair of bit lines B, /BL is provided to each row of memory cells. For simplification of explanation, each memory cell of the seventh embodiment is assumed to have the same configuration as the memory cell of the first embodiment shown in FIG. 1. The memory cell may be the memory cell 1A of the second embodiment shown in FIG. 6, the memory cell 1B of the third embodiment shown in FIG. 8, the memory cell 1C of the fourth embodiment shown in FIG. 13, or the memory cell 1D of the fifth embodiment shown in FIG. 14.

Figure 17:
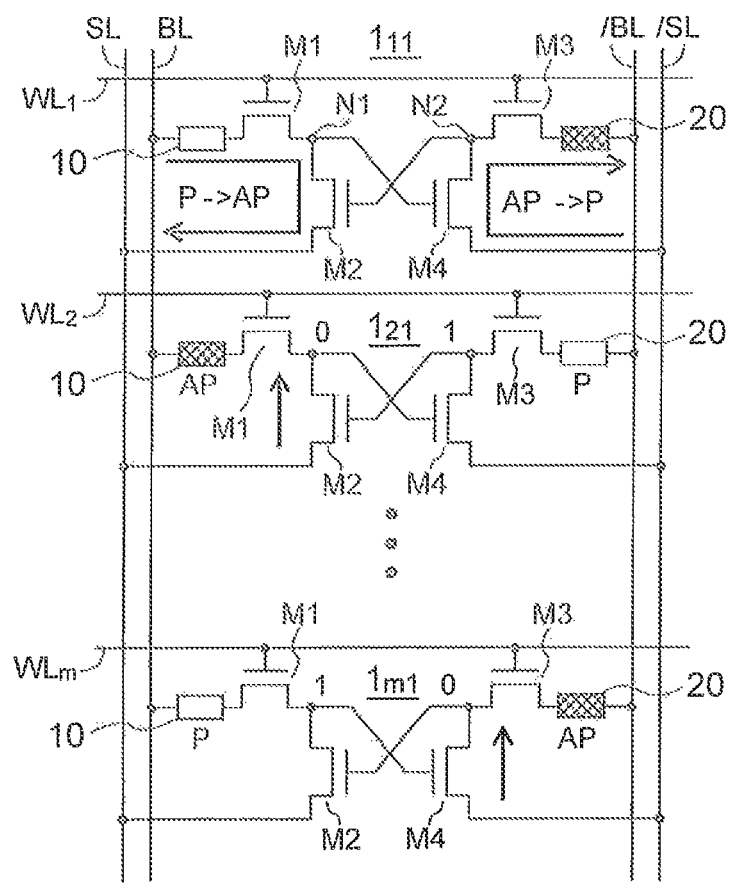
FIG. 17 is a circuit diagram showing a non-volatile memory according to a seventh embodiment.

FIG. 17 shows m memory cells $1_{11}$-$1_{m1}$ In a row, for example the first row, of the seventh embodiment. In each memory cell $1_{i1}$ (i=1, ... m), the other terminal of the MTJ element 10 is connected to the bit line $BL_i$, and the other terminal of the MTJ element 20 is connected to the bit line /$BL_i$. Furthermore, the other of the source and the drain of the transistor M2 in each memory cell is connected to the source line SL, and the other of the source and the drain of the transistor M4 is connected to the source line /SL.

FIGS. 18(a) and 18(b) shows voltages applied to the bit lines BL, /BL and the source lines SL, /SL relating to a selected memory cell of the non-volatile memory according to the seventh embodiment, in an SRAM operation mode and a non-volatile operation mode (MRAM operation mode). FIG. 18(a) shows a case where the source lines SL, /SL are commonly controlled, and FIG. 18(b) shows a case where the source lines SL, /SL are independently controlled. Each of the SRAM operation mode and the MRAM operation mode includes read operations for data "0" and data "1," and the write operations for data "0" and data "1." The indication "Keep" In the SRAM operation of FIGS. 18(a) and 18(b) means that the pre-charge voltage is maintained. The read operation in the MRAM mode in both the cases shown in FIGS. 18(a) and 18(b), and the operations in the MRAM mode in which the source lines SL, /SL are commonly controlled are performed in the same manner as the operations in first embodiment (see FIG. 18(a)).

Since the seventh embodiment includes two source lines, SL and /SL, independent write operations can be performed on the MTJ element 10 and the MTJ element 20 in the MRAM operation mode (see FIG. 18(b)). Specifically, when a voltage is applied to the word line WL to select a memory cell, to which data "0" is to be written, the voltage applied to the source line SL is set at 0 V, and the voltages applied to the bit lines BL, /BL and the source line /SL are increased to $V_{DD}$ to forcibly turn on the transistor M2 to cause a write current to flow between the bit line BL and the source line SL, thereby writing the data to the MTJ element 10. Thereafter, the voltage applied to the bit line /BL is changed to 0 V, and the voltages applied to the source lines SL, /SL and the bit line BL are set at $V_{DD}$ to forcibly turn on the transistor M4 to cause a write current to flow between the bit line /BL and the source line /SL, thereby writing the data to the MTJ element 20. When a voltage is applied to the word line WL to select a memory cell, to which data "1" is to be written, the voltage applied to the bit line BL is set at 0 V, the voltages applied to the source lines SL, /SL and the bit line /BL are increased to $V_{DD}$ to forcibly turn on the transistor M2 to cause a write current to flow between the bit line BL and the source line SL, thereby writing the data to the MTJ element 10. Thereafter, the voltage applied to the source line /SL is changed to 0 V, and the voltages applied to the bit lines BL, /BL and the source line SL are increased to $V_{DD}$ to forcibly turn on the transistor M4 to cause a write current to flow between the bit line /BL and the source line /SL, thereby writing the data to the MTJ element 20. The voltage $V_{DD}$ is higher than the voltages Vmh and Vml. If data are independently written to the MTJ element 10 and the MTJ element 20, such voltages as Vm, Vmh, Vml may be applied instead of 0 V, as shown in FIG. 29. Specifically, when a voltage is applied to the word line WL to select a memory cell, to which data "0" is to be written, the voltage applied to the source line SL is set at Vm, the voltage applied to the bit line BL is set at Vmh, and the voltages applied to the bit lines /BL and the source line /SL are set at Vdd to forcibly turn on the transistor M2 to cause a write current to flow between the bit line BL and the source line SL, thereby writing the data to the MTJ element 10. Thereafter, the voltage applied to the bit line /BL is set at Vml, and the voltage applied to the source line /SL is set at Vm, and the voltages applied to the source line SL and the bit line BL are set at Vdd to forcibly turn on the transistor M4 to cause a write current between the bit line /BL and the source line /SL, thereby writing the data to the MTJ element 20. When a voltage is applied to the word line WL to select a memory cell, to which data "1" is to be written, the voltage applied to the bit line BL is set at Vml, the voltage applied to the source line SL is set at Vm, and the voltages applied to the source line /SL and the bit line /BL are increased to Vdd to forcibly turn on the transistor M2 to cause a write current to flow between the bit line BL and the source line SL, thereby writing the data to the MTJ element 10. Thereafter, the voltage applied to the source line /SL is set at Vm, the voltage applied to the bit line /BL is set at Vmh, and the voltages applied to the bit line BL and the source line SL are set at Vdd to forcibly turn on the transistor M4 to cause a write current to flow between the bit line /BL and the source line /SL, thereby writing the data to the MTJ element 20.

Thus, the writing of non-volatile data can be performed easily by providing a pair of source lines SL, /SL to each row as in the seventh embodiment. In the seventh embodiment, different voltages may be applied to the source lines SL, /SL depending on operations. Thus, the source lines SL, /SL may be connected to different power supplies depending on operations.

FIG. 17 shows the case where a memory cell $1_{11}$ is selected, to which non-volatile data is written. In this case, the memory cells other than the memory cell $1_{11}$, the memory cells $1_{12}$-$1_{1n}$, are in a half-selected state.

According to the seventh embodiment, the standby and operating power consumption can be reduced, and the loss of SRAM data can be prevented as in the case of the first embodiment.

In the first to the seventh embodiments, the non-volatile elements are the MTJ elements. However, other types of non-volatile elements, such as variable-resistance nonvolatile elements (storage elements of ReRAMs) that do not use magnetic materials, and phase-change non-volatile elements (storage elements of PRAMs) may also be used.

If all the memory cells connected to one word line WL are accessed, i.e., read or written, simultaneously in the first to the seventh embodiments, no half-selected memory cell is present.

(Eighth Embodiment)

A case where the number of memory cells to be connected to a word line does not match the number of memory cells to be accessed simultaneously will be described as the eighth embodiment.

(Principle of Half-Selection)

First, the principle of half-selection will be described,

The area of a memory cell including non-volatile elements as in the first to the seventh embodiments can be reduced as compared to the area of a memory cell of a conventional SRAM including six transistors. As a result, the number of the memory cells connected to a word line often exceeds 1024 (1024 bits), which differs from the I/O bit width of a memory module determined by the corresponding computer system. The bit width for which a write request or read request is issued from a CPU bus or memory controller is determined in each system, which is generally 32 to 512 bits. Therefore, if a write access or read access is issued for 32 bits of memory cells in a memory circuit, in which the number of bits of memory cells connected to one word line is 1024, the selection of the word line means that the memory cells other than those of 32 bits to be accessed are also selected. The term "half-selection" means that memory cells that are not to be accessed are unintentionally selected by the selection of a word line. The selection of the word line may affect the data stored in the half-selected memory cells, for which write access or read access is not intended to be performed. The data affected may be rewritten and cause malfunctions. In order to prevent this, the access request from a CPU bus or external I/O may be controlled by a memory controller so that the memory cells to be accessed by the request may be expanded to be 1024 bits, and an access is always made in the unit of 1024 bits. In the cases of the first to the seventh embodiments, if the number of memory cells connected to a CPU bus or I/O differs from the number of memory cells connected to one word line, half-selected memory cells may be generated, which may cause damage to the stored data.

In particular, in the non-volatile memories in the first to seventh embodiments, a current that is higher than the current in a read operation flows through memory cells in a write operation, which may cause a new kind of half-selection that does not occur in a conventional SRAM including six transistors. This new kind of half selection may also cause damage to the stored data. Such a case will be described for the non-volatile memories according to the sixth and the seventh embodiments.

(Half-Selection in Sixth Embodiment)

Figure 19:
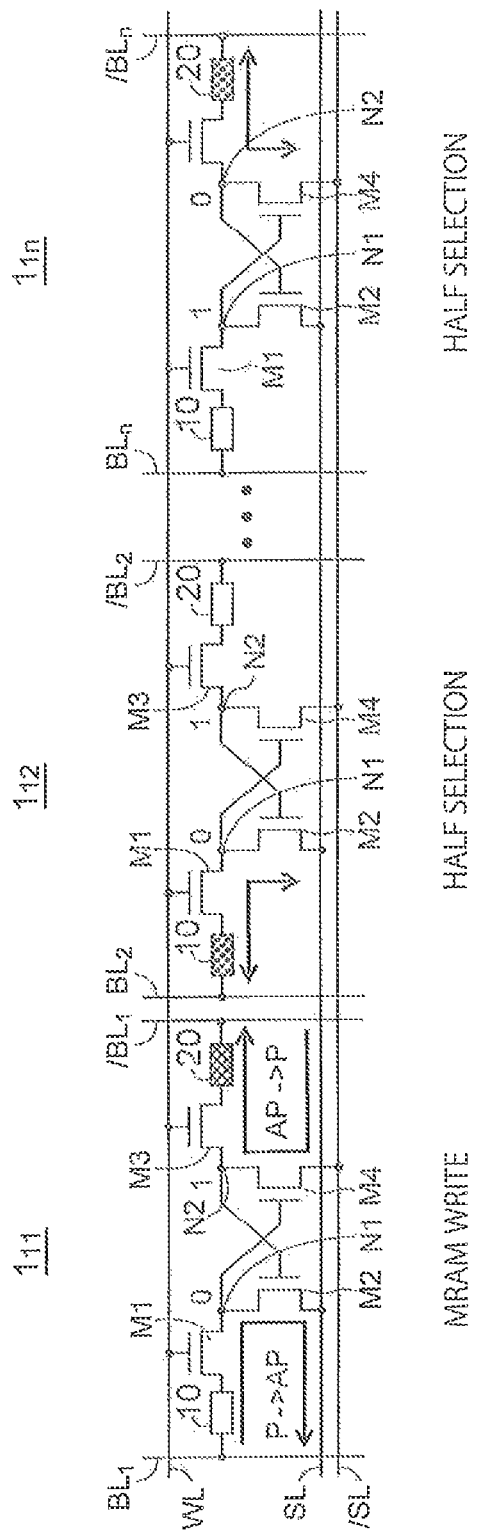
FIG. 19 is a circuit diagram for explaining a half-selected state in the non-volatile memory according to the sixth embodiment.

FIG. 19 shows an example of a case where the stored data may be broken by half-selection in the non-volatile memory according to the sixth embodiment. In FIG. 19, the source lines SL, /SL are disposed in parallel with the word line WL. FIG. 19 shows the state where the word line WL is selected, and a non-volatile writing in the MRAM mode is performed on a part of the memory cells connected to the word line WL, the memory cell $1_{11}$. In order to write data to the non-volatile elements 10, 20, a potential difference should be generated by a driver circuit between the source lines SL, /SL and the bit lines BL, /BL to cause a write current to flow for switching the resistance state of the non-volatile elements 10, 20. At this time, the potential of the source lines SL, /SL is charged from the GND level to a write potential $V_M$. The source lines SL, /SL are also connected to the half-selected memory cells. Therefore, regardless of whether the potential of the bit lines BL, /BL is in a pre-charged state or floating state, a potential difference is caused between the source lines SL, /SL and the bit lines BL, /BL after the source lines SL, /SL are charged to have the write potential $V_M$. As a result, a current flows through the non-volatile elements 10, 20. In this case, the transistor M2 or M4 in the memory cell functions as a pass gate as shown in FIG. 19. Accordingly, a more current flows through the non-volatile element storing the data "0." There is a possibility that the direction in which the current flows may be determined by the relationship between the potential of the bit lines BL, /BL and the potential $V_M$ of the source lines SL, /SL, and a current that can switch the resistance state of the non-volatile elements 10, 20 may flow.

(Half-Selection in Seventh Embodiment)

Figure 20:
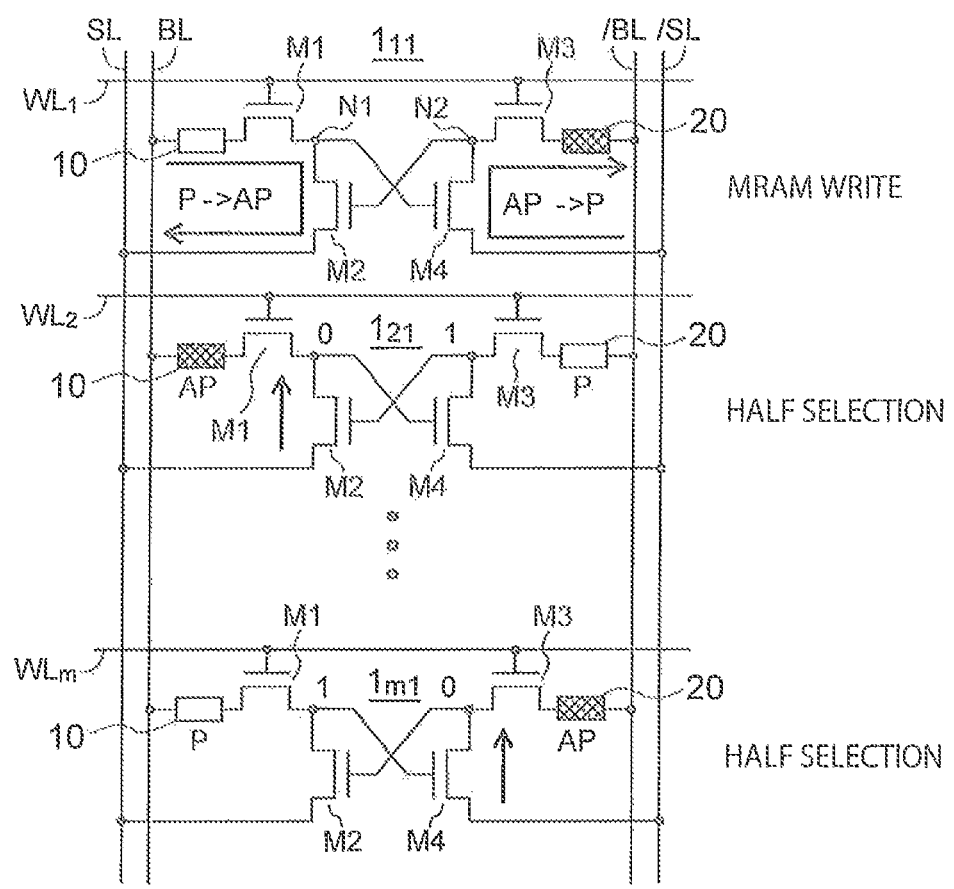
FIG. 20 is a circuit diagram for explaining a half-selected state in the non-volatile memory according to the seventh embodiment.

FIG. 20 shows an example of half-selection state in the seventh embodiment. Like the case shown in FIG. 19, FIG. 20 shows a case where the word line is selected, and a non-volatile writing in the MRAM mode is performed on a part of the memory cells connected to the word line, for example the memory cell $1_{11}$. In FIG. 20, the source lines SL, /SL intersect the word lines $WL_1$-$WL_m$ at a right angle, for example, and extend in parallel to the bit lines BL, /BL. In this case, memory cells $1_{21}$-$1_{m1}$, which are connected to the word line $WL_2$-$WL_m$ that are not selected, may be brought into a half-selected state where the source lines SL, /SL may be charged from the GND level to the write potential $V_M$. Since the source lines SL, /SL intersect the word lines $WL_1$-$WL_m$ at a right angle, as shown in FIG. 20, when the word lines $WL_2$-$WL_m$ are not selected, the transistors M1 and M3 of the half-selected memory cells $1_{21}$-$1_{2m}$ are cut off. Therefore, no current flows between the bit lines BL, /BL and the source lines SL, /SL in each memory cell. However, volatile SRAM data may be connected to the source lines SL, /SL via the transistors M2, M4. Therefore, the charges at the nodes N1, N2 corresponding to the SRAM data may be lost. The transistors M2 and M4 in each memory cell function as pass gates, and the node storing the SRAM data "0" is connected to the source line. As a result, the potential of the node storing the SRAM data "0" Increases, and in the worst case, the transistor on the side of the node storing the SRAM data "1" gradually causes a current to flow. If the time during which a potential is applied to the source lines SL, /SL is sufficiently long, both the transistors M2 and M4 are turned ON, and both the nodes N1, N2 become to have the potential $V_M$. As a result, even if the word lines $WL_2$-$WL_m$ are not selected, the SRAM data may be lost when the source lines SL, /SL are selected.

Thus, since the source lines SL, /SL, in addition to the word line WL and the bit lines BL, /BL, are connected to the memory cells of the first to the seventh embodiments, the internal data corrupting mechanism, which is caused by the half-selected state as described above, may be present.

Figure 21:
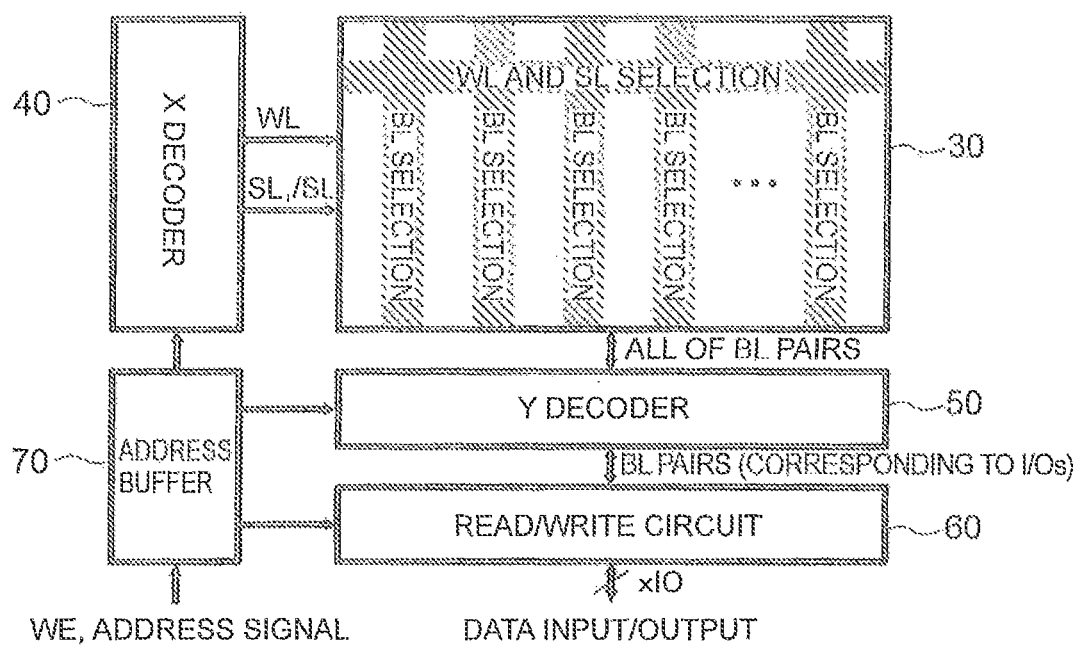
FIG. 21 is a block diagram showing a case where half-selection occurs in the non-volatile memory according to the sixth embodiment.

FIG. 21 shows the entire configuration of the non-volatile memory according to the sixth embodiment. The non-volatile memory includes a memory cell array 30 in which a plurality of memory cell rows shown in FIG. 15 are arranged in a column direction, an X decoder 40 for selecting a word line WL and source lines SL, /SL, to apply a voltage thereto, a Y decoder 50 for selecting all the bit line pairs BL, /BL, a read/write circuit 60 for reading data from the memory cell array 30 via the Y decoder 50, and writing input data to the memory cell array 30 via the Y decoder, and an address buffer 70 for receiving a write signal WE and an address signal and sending them to the X decoder 40, the Y decoder 50, and read/write circuit 60. The read/write circuit 60 receives and transmits data corresponding to the number of I/Os.

In FIG. 21, the word line WL and the source lines SL, /SL are arranged to be parallel to each other. If non-volatile writing is performed on a memory cell to be accessed in such a case, erroneous writing may be performed on the non-volatile elements of the memory cells that are not accessed but in a half-selected state since the word line WL and the source lines SL, /SL connected thereto are selected, or the SRAM data of such non-volatile elements may be lost.

Figure 22:
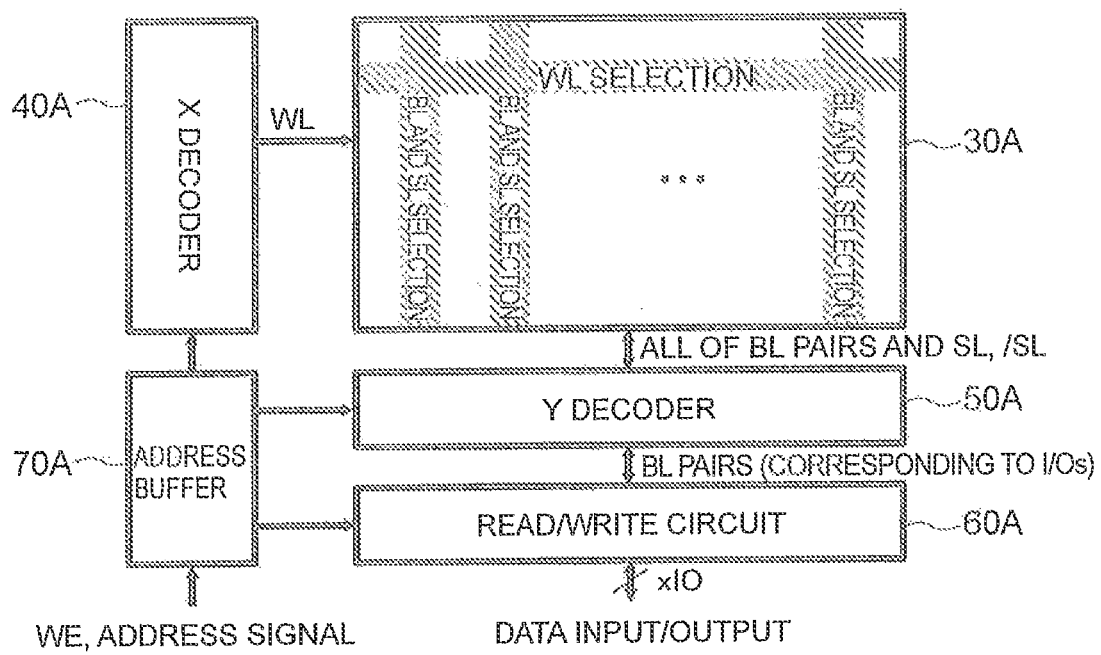
FIG. 22 is a block diagram showing a case where half-selection occurs in the non-volatile memory according to the seventh embodiment.

FIG. 22 shows the entire configuration of the non-volatile memory according to the seventh embodiment. The non-volatile memory includes a memory cell array 30A in which a plurality of memory cell columns shown in FIG. 17 is arranged in a row direction, an X decoder 40A for selecting a word line WL and applying a voltage thereto, a Y decoder 50A for selecting all the bit line pairs BL, /BL and source lines SL, /SL, a read/write circuit 60A for reading data from the memory cell array 30A via the Y decoder 50A, and writing data to the memory cell array 30A via the Y decoder, and an address buffer 70A for receiving a write signal WE and an address signal, and sending them to the X decoder 40A, the Y decoder 50A, and the read/write circuit 60A. The read/write circuit 60A receives and transmits data corresponding to the number of I/Os.

In FIG. 22, the word line WL and the source lines SL, /SL are arranged to intersect each other at a right angle, for example, and the potential of the source lines SL, /SL may be charged to the memory cells for which the word lines WL are not selected. This may cause the loss of SRAM data from non-selected memory cells.

A non-volatile memory capable of preventing data stored in non-selected memory cells from being corrupted in such cases where the number of memory cells connected to a word line does not match the number of memory cells to be accessed simultaneously will be described as the eighth embodiment.

The non-volatile memory according to the eighth embodiment will be described with reference to FIGS. 23 and 24. The non-volatile memory according to the eighth embodiment has a configuration in which the word line and the source line have two levels, global and local, and a column line CL for selecting a column is newly provided.

Figure 23:
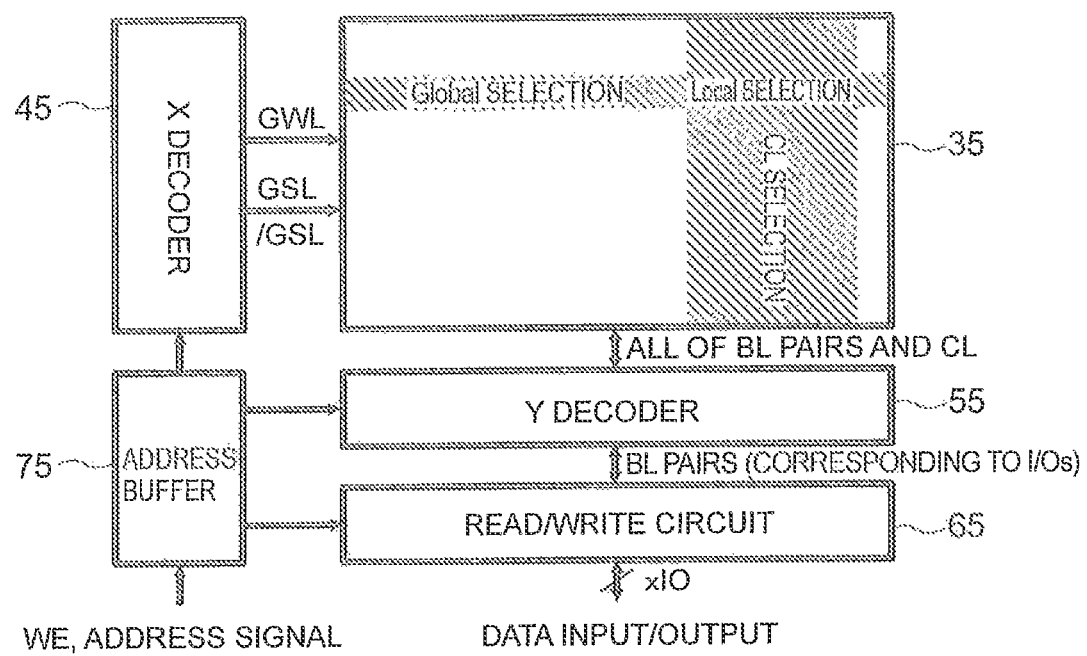
FIG. 23 is a block diagram of a non-volatile memory according to an eighth embodiment.

FIG. 23 is a block diagram showing the non-volatile memory according to the eighth embodiment. The non-volatile memory according to the eighth embodiment includes a memory cell array 35 in which a plurality of memory cells is arranged in a matrix form, an X decoder 45 for selecting a global word line GWL and global source lines GSL, /GSL to apply a voltage thereto, a Y decoder 55 for selecting all the bit line pairs BL, /BL and column lines CL, a read/write circuit 65 for reading data from the memory cell array 35 via the Y decoder 55, and writing data to the memory cell array 35 via the Y decoder 55, and an address buffer 75 for receiving a write signal WE and an address signal, and transmitting them to the X decoder 45, the Y decoder 55, and the read/write circuit 65. The read/write circuit 65 receives and transmits data corresponding to the number of I/Os. In FIG. 23, the global word lines GWL and the global source lines GSL, /GSL are arranged in parallel.

Figure 24:
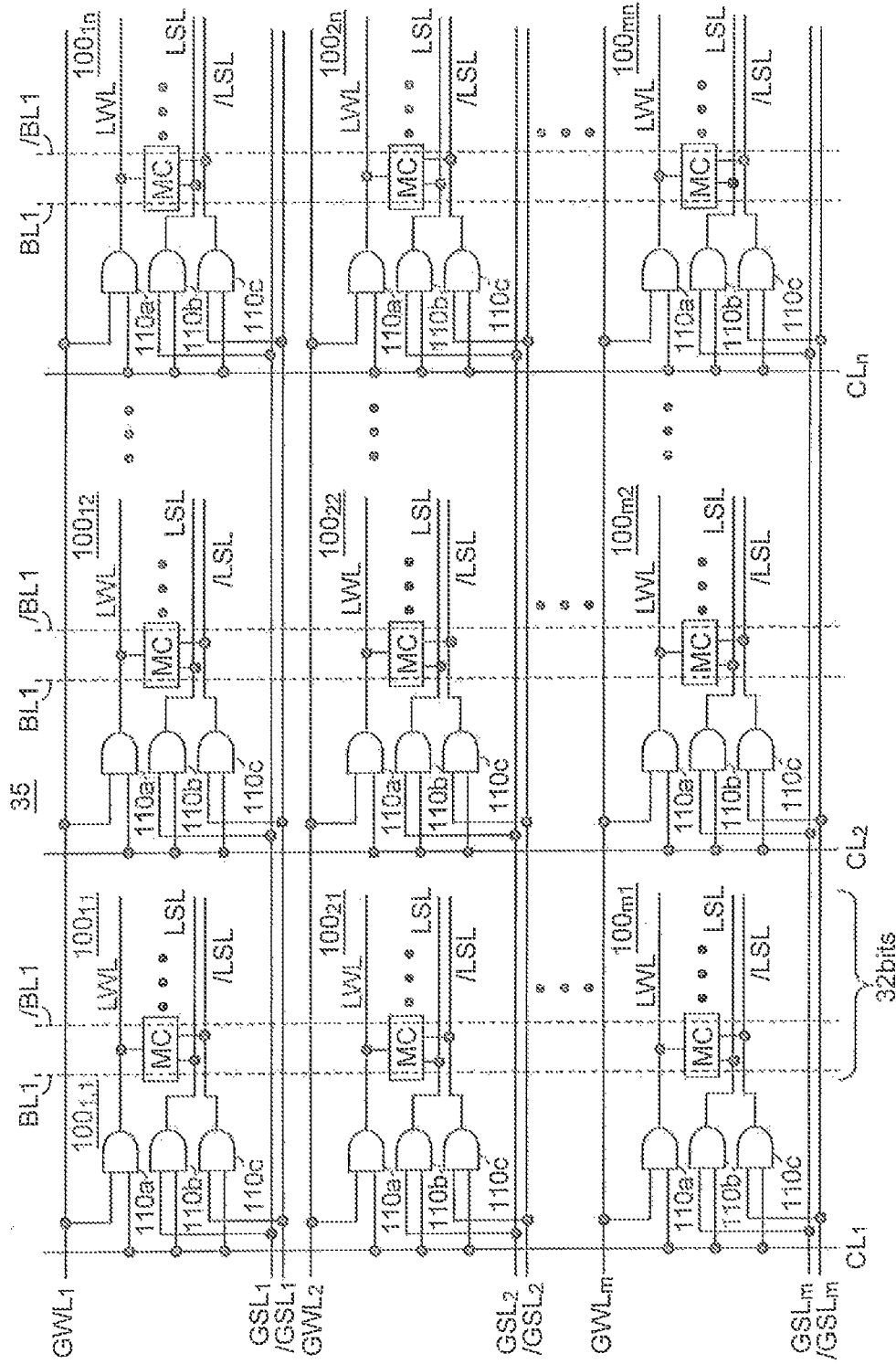
FIG. 24 is a circuit diagram showing a memory cell array of a non-volatile memory according to the eighth embodiment.

FIG. 24 shows the memory cell array 35 of the eighth embodiment. The memory cell array 35 includes a plurality of global memory cells 100E (i=1, ..., m, j=1, ..., n) arranged in a matrix form, where m and n each denote an integer equal to or more than 1. Thus, the number of global memory cells is m×n. Each global memory cell 100, (i=1, ..., m, j=1, ..., n) includes three AND gates 110a, 110b, 110c and 32 memory units MC. Each memory unit MC has the same configuration as each memory cell of the sixth embodiment shown in FIG. 15. Thus, each memory unit MC includes two transistors M1, M2 that are connected in series to form a first series circuit, two transistors M3, M4 that are connected in series to form a second series circuit, a non-volatile element 10 connected to the first series circuit, and a non-volatile element 20 that is connected to the second series circuit at a location corresponding to the location at which the non-volatile element 10 is connected to the first series circuit, as shown in FIG. 15. The locations of the non-volatile elements 10, 20 in FIG. 15 are the same as those of the memory cells in the first embodiment shown in FIG. 1. However, the locations may be the same as those of the memory cells of the second embodiment shown in FIG. 6, those of the memory cells of the third embodiment shown in FIG. 8, those of the memory cells of the fourth embodiment shown in FIG. 13, and those of the memory cells of the fifth embodiment shown in FIG. 14.

In the eighth embodiment, each global memory cell stores data of 32 bits. Thus, in total, the non-volatile memory stores data of m×32n bits.

In each global memory cell $100_{ij}$ (1=1, ..., m, j=1, ..., n), the AND gate 110a is a selection unit that performs a logical operation based on a signal from the global word line $GWL_i$ and a signal from the column line $CL_j$, and selects a local word line LWL based on the operation result. The AND gate 110b is a selection unit that performs a logical operation based on a signal from the global source line $GSL_i$ and a signal from the column line $CL_j$, and selects a local source line LSL based on the operation result. The AND gate 110c is a selection unit that performs a logical operation based on a signal from the global source line $/GSL_i$ and a signal from the column line $CL_j$, and selects a local source line /LSL based on the operation result. In each memory unit MC of each global memory cell $100_{ij}$ (i=1, ..., m, j=1, ..., n), the gates of the transistors M1, M2 are connected to the local word line LWL, and the other of the source and the drain of the transistor M2 is connected to the local source line LSL, and the other of the source and the drain of the transistor M4 is connected to the local source line /LSL. Thus, in each global memory cell $100_{ij}$ (I=1, ..., m, j=1, ..., n), the 32 memory units MC are simultaneously accessed. Although a pair of bit lines BL, /BL is provided to each memory unit MC in the eighth embodiment, the pair is omitted in FIG. 24 to simplify the diagram.

In the eighth embodiment having such a configuration, first a global word line and global source lines are selected, and then a memory cell in a column selected by a column line CL is selected. Thus, the local word line LWL and the local source lines LSL, /LSL are not selected for the memory cells that are not accessed. Therefore, no corruption of stored data is caused by half-selection.

In each global memory cell $100_{ij}$ (i=1, ..., m, j=1, ..., n), the AND gate 110a serving as a selection unit may be a transfer gate for connecting the global word line GWL and the local word line LWL based on a signal from the column line $CL_j$. The AND gate 110b serving as a selection unit may be a transfer gate for connecting the global source line GSL and the local source line LSL based on a signal from the column line $CL_j$. The AND gate 110c serving as a selection unit may be a transfer gate for connecting the global source line /GSL and the local source line /LSL based on a signal from the column line $CL_j$.

Depending on operations, different voltages are applied to the global source lines GSL, /GSL in the eighth embodiment. Thus, the global source lines GSL, /GSL are connected to different power supplies depending on operations.

(Modification)

Figure 25:
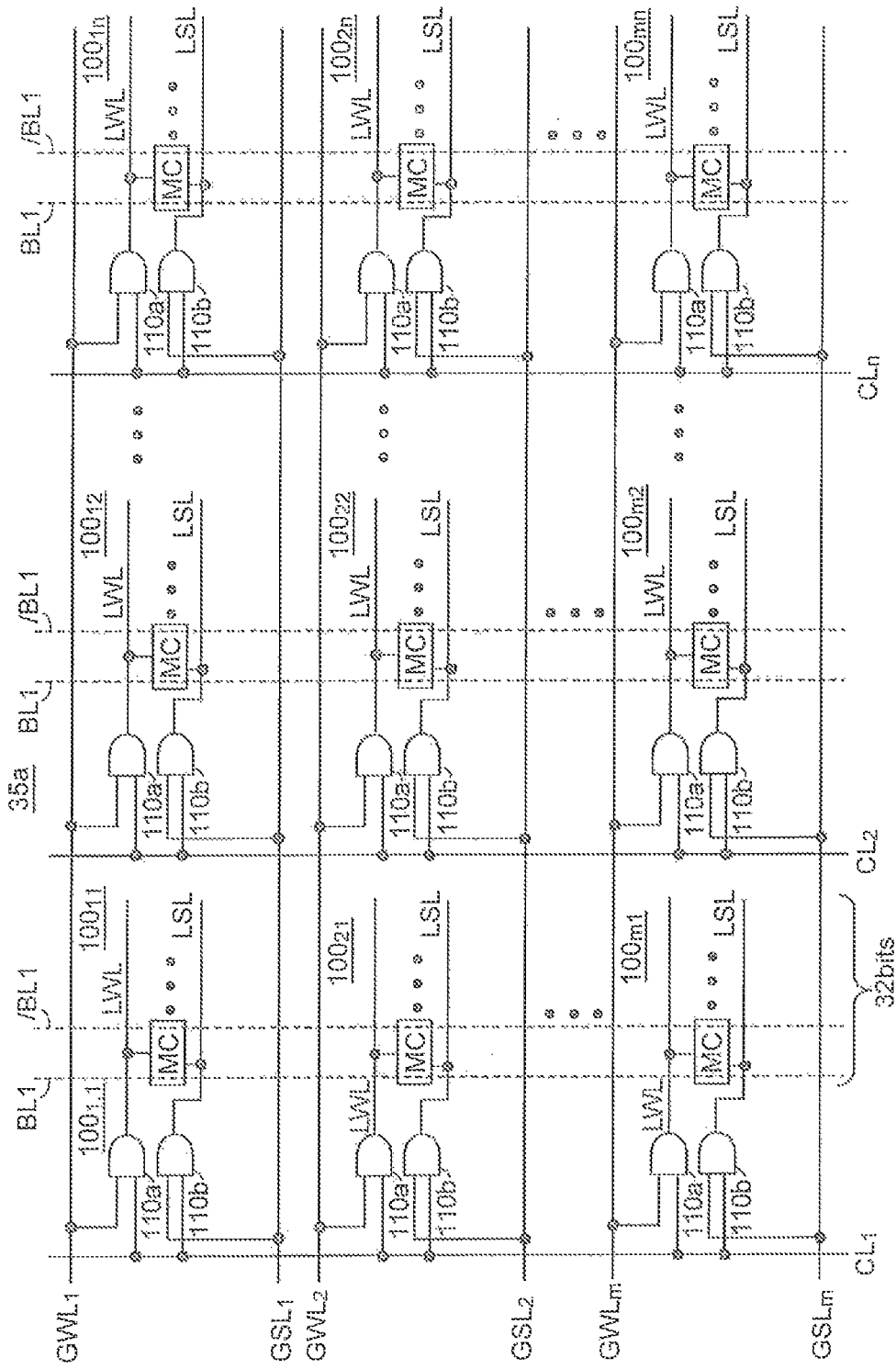
FIG. 25 is a circuit diagram showing a memory cell array of a non-volatile memory according to a modification of the eighth embodiment.

A non-volatile memory according to a modification of the eighth embodiment will be described with reference to FIG. 25. The non-volatile memory according to the modification is obtained by replacing the memory cell array 35 of the non-volatile memory according to the eighth embodiment with a memory cell array 35a shown in FIG. 25. The memory cell array 35a is obtained by eliminating the global source lines /GSL and the AND gates 110c from the memory cell array 35 shown in FIG. 24. Each memory unit MC of the memory cell array 35a may be the memory cell of the first embodiment shown in FIG. 1, the memory cell of the second embodiment shown in FIG. 6, the memory cell of the third embodiment shown in FIG. 8, the memory cell of the fourth embodiment shown in FIG. 13, and the memory cell of the fifth embodiment shown in FIG. 14. Thus, each row is connected to one global source line GSL, and each global memory cell is connected to one local source line LSL. In each global memory cell, the other of the source and the drain of each of the transistors M2, M4 of each memory unit MC is connected to the local source line LSL.

As in the eighth embodiment, in the non-volatile memory of the modification, a global word line and a global source line are first selected, and then a memory cell in a column selected by a column line CL is selected. Thus, the local word line LWL and the local source line LSL are not selected for the memory cells that are not to be accessed. Therefore, no corruption of stored data is caused by half-selection.

Also in the modification of the eighth embodiment, different voltages are applied to the global source lines GSL depending on operations. Thus, the global source lines GSL are connected to different power supplies depending on operations.

(Ninth Embodiment)

A non-volatile memory according to the ninth embodiment will be described with reference to FIGS. 26 and 27. As in the case of the eighth embodiment, the non-volatile memory of the ninth embodiment has a configuration in which the word line and the source line have two levels, global and local, and a column line CL for selecting a column is newly provided.

Figure 26:
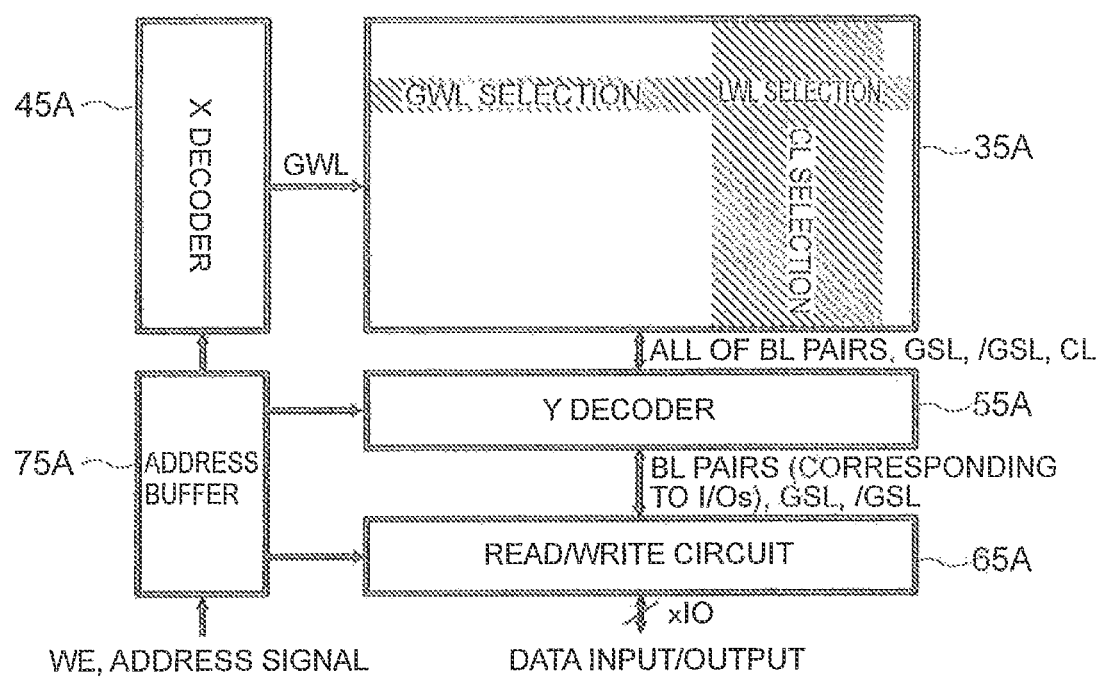
FIG. 26 is a block diagram showing a non-volatile memory according to a ninth embodiment.

FIG. 26 is a block diagram showing a non-volatile memory according to the ninth embodiment. The non-volatile memory according to the ninth embodiment includes a memory cell array 35A in which a plurality of memory cells is arranged in a matrix form, an X decoder 45A for selecting a global word line GWL and applying a voltage thereto, a Y decoder 55A for selecting all the bit line pairs BL, /BL, global source lines GSL, /GSL, and column lines CL, a read/write circuit 65A for reading data from the memory cell array 35A via the Y decoder 55A, and writing data to the memory cell array 35A via the Y decoder 55A, and an address buffer 75A for receiving a write signal WE and an address signal, and sending them to the X decoder 45A, the Y decoder 55A, and the read/write circuit 65A. The read/write circuit 65A receives data corresponding to the number of I/Os. The read/write circuit 65A also transmits data corresponding to the number of I/Os. In FIG. 26, the global word lines GWL and the global source lines GSL, /GSL intersect each other at a right angle, for example.

Figure 27:
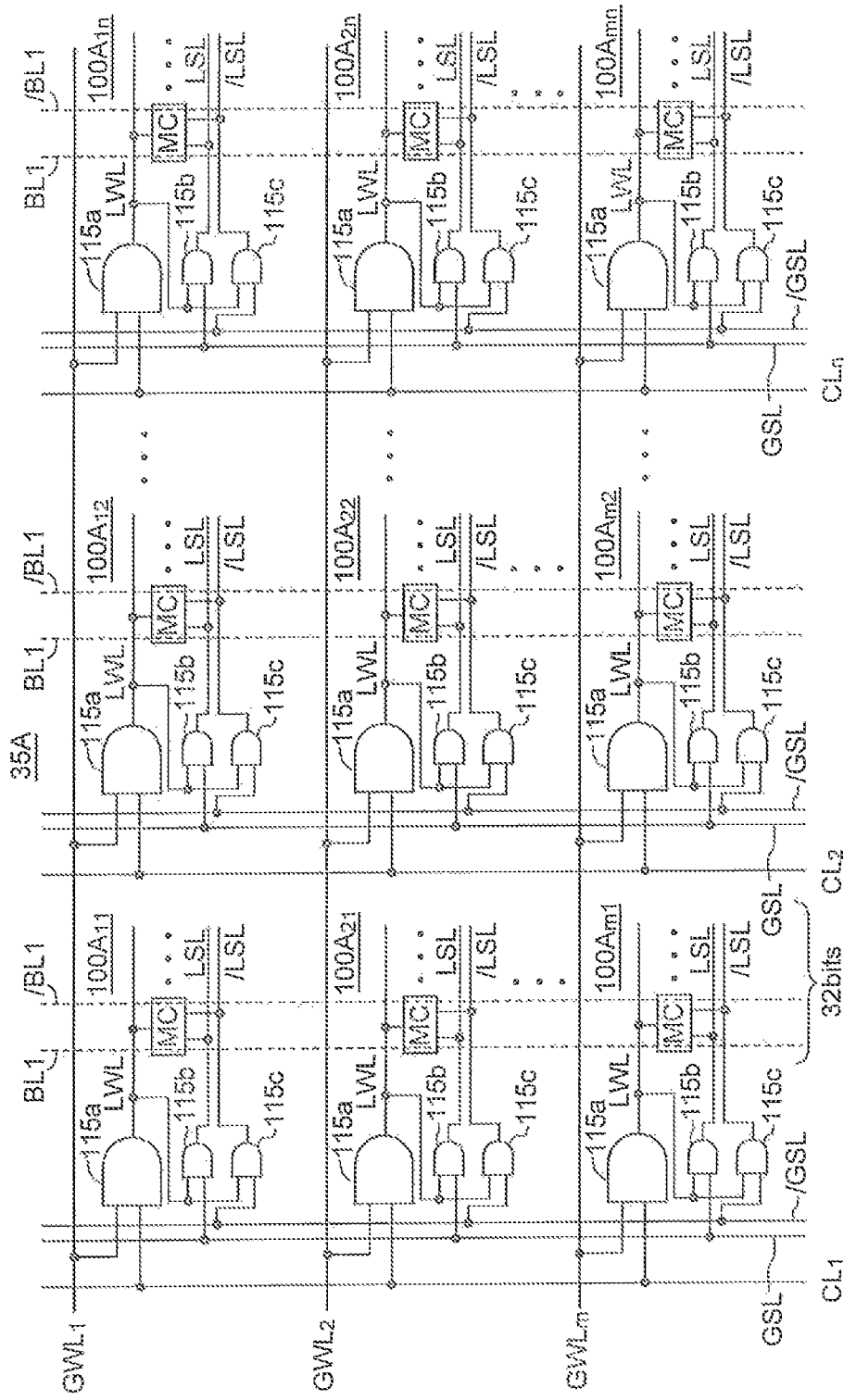
FIG. 27 is a circuit diagram showing a memory cell array of a non-volatile memory according to the ninth embodiment.

FIG. 27 shows the memory cell array 35A of the ninth embodiment. The memory cell array 35A includes a plurality of global memory cells $100A_{ij}$ (i=1, ..., m, j=1, ..., n) arranged in a matrix form, where m and n each denote an integer equal to or more than 1. Thus, the number of global memory cells is m×n. Each global memory cell $100A_{ij}$ (I=1, ..., m, j=1, ..., n) includes three AND gates 115a, 115b, 115c and 32 memory units MC. Each memory unit MC has the same configuration as the memory cell according to the seventh embodiment shown in FIG. 17. Thus, each memory unit MC includes two transistors M1, M2 connected in series to form a first series circuit, two transistors M3, M4 connected in series to form a second series circuit, a non-volatile element 10 connected to the first series circuit, and a non-volatile element 20 connected to the second series circuit at a location corresponding to the location at which the non-volatile element 10 is connected to the first series circuit, as shown in FIG. 17. The locations of the non-volatile elements 10, 20 in FIG. 17 are the same as those of the memory cells in the first embodiment shown in FIG. 1. The locations may be the same as those of the memory cells of the second embodiment shown in FIG. 6, those of the memory cells of the third embodiment shown in FIG. 8, those of the memory cells of the fourth embodiment shown in FIG. 13, and those of the memory cells of the fifth embodiment shown in FIG. 14.

In the ninth embodiment, each global memory cell stores data of 32 bits. Thus, in total, the non-volatile memory stores data of m×32n bits.

In each global memory cell $100A_{ij}$ (i=1, ..., m, j=1, ..., n), the AND gate 115a is a selection unit that performs a logical operation based on a signal from the global word line $GWL_i$ and a signal from the column line $CL_j$, and selects a local word line LWL based on the operation result. The AND gate 115b is a selection unit that performs a logical operation based on a signal from the local word line LWL and a signal from the global source line $GSL_j$, and selects a local source line LSL based on the operation result. The AND gate 115c is a selection unit that performs a logical operation based on a signal from the local word line LWL and a signal from the global source line $/GSL_j$, and selects a local source line /LSL based on the operation result. In each memory unit MC of each global memory cell $100A_{ij}$ (i=1, ..., m, j=1, ..., n), the gates of the transistors M1, M2 are connected to the local word line LWL, and the other of the source and the drain of the transistor M2 is connected to the local source line LSL, and the other of the source and the drain of the transistor M4 is connected to the local source line /LSL. Thus, in each global memory cell $100A_{ij}$ (i=1, ..., m, j=1, ..., n), the 32 memory units MC are simultaneously accessed. Although a pair of bit lines BL, /BL is provided to each memory unit MC in the ninth embodiment, the pair is omitted in FIG. 27 to simplify the diagram.

In the ninth embodiment having such a configuration, first the global word line and the global source line are selected, and then a column is selected by the column line CL. Thus, the local word line LWL and the local source lines LSL, /LSL are not selected for the memory cells that are not accessed. Therefore, no corruption of stored data is caused by half-selection.

In each global memory cell $100A_{ij}$ (i=1, ..., m, j=1, ..., n), the AND gate 110a serving as a selection unit may be a transfer gate for connecting the global word line GWL and the local word line LWL based on a signal from the column line $CL_j$. The AND gate 110b serving as a selection unit may be a transfer gate for connecting the global source line GSL and the local source line LSL based on a signal from the local word line LWL. The AND gate 110c serving as a selection unit may be a transfer gate for connecting the global source line /GSL and the local source line /LSL based on a signal from the local word line LWL.

Also in the ninth embodiment, different voltages are applied to the global source lines GSL, /GSL depending on operations. Thus, the global source lines GSL, /GSL are connected to different power supplies depending on operations.

(Modification)

Figure 28:
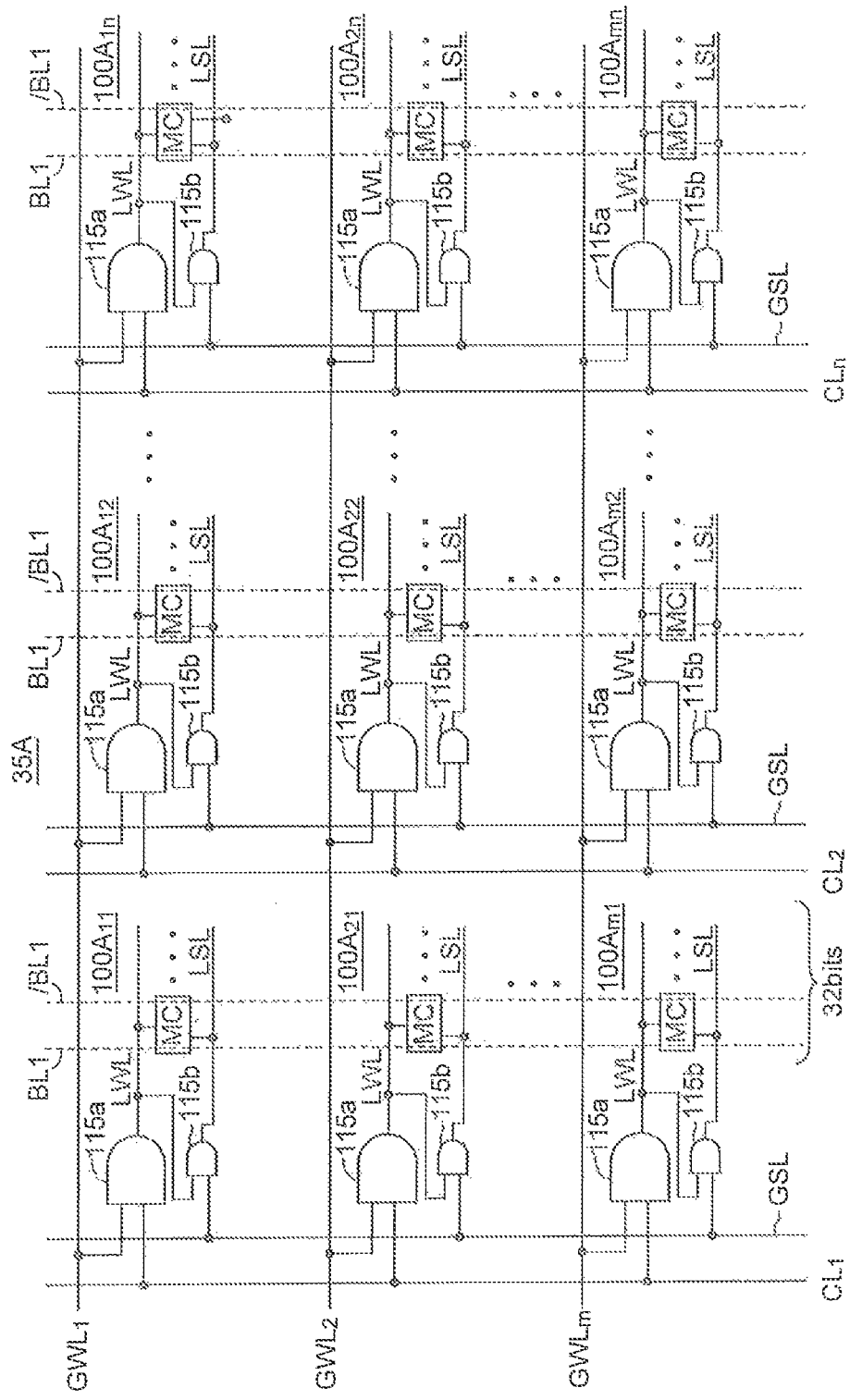
FIG. 28 is a circuit diagram showing a memory cell array of a non-volatile memory according to a modification of the ninth embodiment.

A non-volatile memory according to a modification of the ninth embodiment will be described with reference to FIG. 28. The non-volatile memory according to the modification is obtained by replacing the memory cell array 35A of the non-volatile memory according to the ninth embodiment with a memory cell array 35Aa shown in FIG. 28. The memory cell array 35Aa has a configuration obtained by eliminating the global source line /GSL and the AND gates 110c from the memory cell array 35A shown in FIG. 24. Each memory unit MC has the same configuration as the memory cell of the first embodiment shown in FIG. 1, the memory cell of the second embodiment shown in FIG. 6, the memory cell of the third embodiment shown in FIG. 8, the memory cell of the fourth embodiment shown in FIG. 13, or the memory cell of the fifth embodiment shown in FIG. 14. Thus, each row is connected to one global source line GSL, and each global memory cell is connected to one local source line LSL.

As in the ninth embodiment, in the non-volatile memory of the modification, a global word line and a global source line are first selected, and then a memory cell in a column selected by a column line CL is selected. Thus, the local word line LWL and the local source line LSL are not selected for the memory cells that are not to be accessed. Therefore, no corruption of stored data is caused by half-selection.

Also in the modification of the ninth embodiment, different voltages are applied to the global source lines GSL depending on operations. Thus, the global source lines GSL are connected to different power supplies depending on operations.

A writing method for the memory according to an embodiment, may include: applying a first voltage to the second wiring line corresponding to a memory cell to be selected, a second voltage that is different from the first voltage to the third wiring corresponding to the memory cell to be selected, and a third voltage between the first voltage and the second voltage to the fourth wiring corresponding to the memory cell to be selected; and applying a fourth voltage to the first wiring line corresponding to the memory cell to be selected.

A reading method for the memory according to an embodiment, may include: applying a first voltage to the first wiring line corresponding to a memory cell to be selected, a second voltage to the second wiring line and the third wiring line corresponding to the memory cell to be selected, and a third voltage that is different from the second voltage to the fourth wiring line corresponding to the memory cell to be selected.

A writing method for the memory according to an embodiment, may include: applying a voltage to the first wiring line corresponding to a memory cell to be selected, thereby selecting the memory cell to be selected; applying a voltage to each of the second wiring line, the third wiring line, the fifth wiring line, and the sixth wiring line corresponding to the memory cell to be selected so that the second transistor is turned on to write data to the first non-volatile element; and applying a voltage to each of the second wiring line, the third wiring line, the fifth wiring line, and the sixth wiring line corresponding to the memory cell to be selected so that the fourth transistor is turned on to write data to the second non-volatile element, which data is different from the data written to the first non-volatile element.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A non-volatile memory comprising:
a plurality of memory cells arranged in a matrix form;
a plurality of first wiring lines each corresponding to memory cells of a common row;
a plurality of second wiring lines and a plurality of third wiring lines, each of the plurality of second wiring lines corresponding to memory cells of a common column, each of the plurality of third wiring lines corresponding to memory cells of the common column; and
a plurality of fourth wiring lines and fifth wiring lines, each of the plurality of fourth wiring lines and fifth wiring lines corresponding to the memory cells of one of the common row and the common column; each of the memory cells including a plurality of transistors, a first non-volatile element, a second non-volatile element, a first node, and a second node,
the transistors including a first transistor, a second transistor, a third transistor, and a fourth transistor,
the first transistor and the second transistor being connected in series with the first non-volatile element,
the third transistor and the fourth transistor being connected in series with the second non-volatile element,
the first node being disposed between the first transistor and the second transistor,
the second node being disposed between the third transistor and the fourth transistor,
gates of the first transistor and the third transistor being connected to one of the first wiring lines,
a gate of the second transistor being connected to the second node,
a gate of the fourth transistor being connected to the first node,
the first transistor being connected between one of the second wiring lines and the first node,
the second transistor being connected between the first node and one of the fourth wiring lines,
the third transistor being connected between one of the third wiring lines and the second node,
the fourth transistor being connected between the second node and the one of the fifth wiring lines, the first non-volatile element being disposed between the one of the second wiring lines and the first transistor, between the first transistor and the first node, between the first node and the second transistor, or between the second transistor and the one of the fourth wiring lines, and the second non-volatile element being disposed at a location corresponding to a location of the first non-volatile element, between the one of the third wiring lines and the third transistor, between the third transistor and the second node, between the second node and the fourth transistor, or between the fourth transistor and the one of the fifth wiring lines.

2. The memory according to claim 1, wherein in each of the memory cells, the first non-volatile element is disposed between the one of the second wiring lines and the first transistor, and the second non-volatile element is disposed between the one of the third wiring lines and the third transistor.

3. The memory according to claim 1, wherein in each of the memory cells, the first non-volatile element is disposed between the first transistor and the first node, and the second non-volatile element is disposed between the third transistor and the second node.

4. The memory according to claim 1, wherein in each of the memory cells, the first non-volatile element is disposed between the first node and the second transistor, and the second non-volatile element is disposed between the second node and the fourth transistor.

5. The memory according to claim 1, wherein in each of the memory cells, the first non-volatile element is disposed between the second transistor and the one of the fourth wiring lines, and the second non-volatile element is disposed between the fourth transistor and the one of the fifth wiring lines.

6. The memory according to claim 1, wherein the fourth wiring lines and the fifth wiring lines being disposed along the first wiring lines.

7. The memory according to claim 1, wherein the fourth wiring lines being disposed along the second wiring lines, and the fifth wiring lines being disposed along the third wiring lines.

8. A non-volatile memory comprising:
a plurality of memory cells arranged in a matrix form;
a plurality of first wiring lines each corresponding to memory cells of a common row;
a plurality of second wiring lines and a plurality of third wiring lines, each of the plurality of second wiring lines corresponding to memory cells of a common column, each of the plurality of third wiring lines corresponding to memory cells of the common column; and
a plurality of fourth wiring lines and fifth wiring lines, each of the plurality of fourth wiring lines and fifth wiring lines corresponding to the memory cells of one of the common row and the common column;
each of the memory cells including a plurality of transistors, a first non-volatile element, a second non-volatile element, a first node, and a second node,
the transistors including a first transistor, a second transistor, a third transistor, and a fourth transistor,
the first transistor and the second transistor being connected in series,
the third transistor and the fourth transistor being connected in series,
the first node being disposed between the first transistor and the second transistor,
the second node being disposed between the third transistor and the fourth transistor,
gates of the first transistor and the third transistor being connected to one of the first wiring lines,
a gate of the second transistor being connected to the second node,
a gate of the fourth transistor being connected to the first node,
the first transistor being connected between one of the second wiring lines and the first node,
the second transistor being connected between the first node and one of the fourth wiring lines,
the third transistor being connected between one of the third wiring lines and the second node,
the fourth transistor being connected between the second node and the one of the fifth wiring lines,
the first non-volatile element being connected between the first node and the gate of the fourth transistor, and
the second non-volatile element being disposed between the second node and the gate of the second transistor.

9. The memory according to claim 8, wherein the fourth wiring lines and the fifth wiring lines being disposed along the first wiring lines.

10. The memory according to claim 8, wherein the fourth wiring lines being disposed along the second wiring lines, and the fifth wiring lines being disposed along the third wiring lines.

11. A non-volatile memory comprising:
a plurality of memory cells arranged in a matrix form;
a plurality of first global wiring lines each corresponding to memory cells of a common row;
a plurality of second global wiring lines and a plurality of third global wiring lines;
a plurality of fourth global wiring lines each corresponding to the memory cells of a common column; and
a plurality of fifth global wiring lines and a plurality of sixth global wiring lines,
each of the memory cells including a plurality of memory units, a selection circuit, a first local wiring line, a second local wiring line, and a third local wiring line,
the second global wiring lines and the third global wiring lines corresponding to the memory units of the memory cells of the common column,
in each of the memory cells,
each of the memory units including a plurality of transistors, a first non-volatile element, a second non-volatile element, a first node, and a second node,
the transistors including a first transistor, a second transistor, a third transistor, and a fourth transistor,
the first transistor and the second transistor being connected in series with the first non-volatile element,
the third transistor and the fourth transistor being connected in series with the second non-volatile element,
the first node being disposed between the first transistor and the second transistor,
the second node being disposed between the third transistor and the fourth transistor,
gates of the first transistor and the third transistor being connected to the first local wiring line,
a gate of the second transistor being connected to the second node,
a gate of the fourth transistor being connected to the first node,
the first transistor being connected between a corresponding second global wiring line and the first node,
the second transistor being connected between the first node and the second local wiring line,
the third transistor being connected between a corresponding third global wiring line and the second node,
the fourth transistor being connected between the second node and the third local wiring line,
the first non-volatile element being disposed between the corresponding second global wiring line and the first transistor, between the first transistor and the first node, between the first node and the second transistor, or between the second transistor and the second local wiring line,
the second non-volatile element being disposed between the corresponding third global wiring line and the third transistor, between the third transistor and the second node, between the second node and the fourth transistor, or between the fourth transistor and the third local wiring line, at a location corresponding to a location of the first non-volatile element, and
the selection circuit selecting the first local wiring line, the second local wiring line, the third local wiring line based on a signal from a corresponding first global wiring line, a signal from a corresponding fourth global wiring line, a signal from a corresponding fifth global wiring line, and a signal from a corresponding sixth global wiring line.

12. The non-volatile memory according to claim 11, wherein the selection circuit includes a first selection unit, a second selection unit, and a third selection unit,
the first selection unit selects the first local wiring line based on the signal from the corresponding first global wiring line and the signal from the corresponding fourth global wiring line, the second selection unit selects the second local wiring line based on the signal from the corresponding fourth global wiring line and the signal from the corresponding fifth global wiring line, the third selection unit selects the third local wiring line based on the signal from the corresponding fourth global wiring line and the signal from the corresponding sixth global wiring line, each of the fifth global wiring lines corresponds to the memory cells of the common row, and each of the sixth global wiring lines corresponds to the memory cells of the common row.

13. The non-volatile memory according to claim 11, wherein the selection circuit includes a first selection unit, a second selection unit, and a third selection unit, the first selection unit selects the first local wiring line based on the signal from the corresponding first global wiring line and the signal from the corresponding fourth global wiring line, the second selection unit selects the second local wiring line based on a signal from a first selection unit and the signal from the corresponding fifth global wiring line, and the third selection unit selects the third local wiring line based on the signal from the first selection unit and the signal from the corresponding sixth global wiring line, each of the fifth global wiring lines corresponds to the memory cells of the common column, and each of the sixth global wiring lines corresponds to the memory cells of the common column.

14. A non-volatile memory comprising:

a plurality of memory cells arranged in a matrix form;

a plurality of first global wiring lines each corresponding to memory cells of a common row;

a plurality of second global wiring lines and a plurality of third global wiring lines;

a plurality of fourth global wiring lines each corresponding to memory cells of a common column; and a plurality of fifth global wiring lines, each of the memory cells including a plurality of memory units, a selection circuit, a first local wiring line, and a second local wiring line, the second global wiring lines and the third global wiring lines corresponding to the memory units of the memory cells of the common column, in each of the memory cells, each of the memory units including a plurality of transistors, a first non-volatile element, a second non-volatile element, a first node, and a second node, the transistors including a first transistor, a second transistor, a third transistor, and a fourth transistor, the first transistor and the second transistor being connected in series with the first non-volatile element, the third transistor and the fourth transistor being connected in series with the second non-volatile element, the first node being disposed between the first transistor and the second transistor, the second node being disposed between the third transistor and the fourth transistor, gates of the first transistor and the third transistor being connected to the first local wiring line, a gate of the second transistor being connected to the second node, a gate of the fourth transistor being connected to the first node, the first transistor being connected between a corresponding second global wiring line and the first node, the second transistor being connected between the first node and the second local wiring line, the third transistor being connected between a corresponding third global wiring line and the second node, the fourth transistor being connected between the second node and the second local wiring line, the first non-volatile element being disposed between the corresponding second global wiring line and the first transistor, between the first transistor and the first node, between the first node and the second transistor, or between the second transistor and the second local wiring line, the second non-volatile element being disposed between the corresponding third global wiring line and the third transistor, between the third transistor and the second node, between the second node and the fourth transistor, or between the fourth transistor and the second local wiring line, at a location corresponding to a location of the first non-volatile element, and the selection circuit selecting the first local wiring line and the second local wiring line based on a signal from a corresponding first global wiring line, a signal from a corresponding fourth global wiring line, and a signal from a corresponding fifth global wiring line.

15. The non-volatile memory according to claim 14, wherein the selection circuit includes a first selection unit and a second selection unit, the first selection unit selects the first local wiring line based on the signal from the corresponding first global wiring line and the signal from the corresponding fourth global wiring line, the second selection unit selects the second local wiring line based on the signal from the corresponding fourth global wiring line and the signal from the corresponding fifth global wiring line, and each of the fifth global wiring lines corresponds to the memory cells of the common row.

16. The non-volatile memory according to claim 14, wherein the selection circuit includes a first selection unit and a second selection unit, the first selection unit selecting the first local wiring line based on the signal from the corresponding first global wiring line and the signal from the corresponding fourth global wiring line, the second selection unit selecting the second local wiring line based on a signal from the first selection unit and the signal from the corresponding fifth global wiring line, and each of the fifth global wiring lines corresponds to the memory cells of the common column.

* * * * *